United States Patent
Taniyama et al.

(10) Patent No.: US 6,827,814 B2
(45) Date of Patent: Dec. 7, 2004

(54) PROCESSING APPARATUS, PROCESSING SYSTEM AND PROCESSING METHOD

(75) Inventors: Hiroki Taniyama, Saga (JP); Shigenori Kitahara, Saga (JP); Takanori Miyazaki, Saga (JP); Hironobu Nishi, Kanagawa (JP); Yoshinori Kato, Mie (JP)

(73) Assignee: Tokyo Electron Limited, Tokyo (JP)

( * ) Notice: Subject to any disclaimer, the term of this patent is extended or adjusted under 35 U.S.C. 154(b) by 426 days.

(21) Appl. No.: 09/849,880

(22) Filed: May 4, 2001

(65) Prior Publication Data

US 2001/0037858 A1 Nov. 8, 2001

(30) Foreign Application Priority Data

| May 8, 2000 | (JP) | ........................................ | 2000-135222 |
| May 8, 2000 | (JP) | ........................................ | 2000-135224 |
| May 8, 2000 | (JP) | ........................................ | 2000-135226 |

(51) Int. Cl.⁷ ........................................ H01L 21/027
(52) U.S. Cl. .................. 156/345.12; 134/113
(58) Field of Search ...................... 156/345.12; 134/113

(56) References Cited

U.S. PATENT DOCUMENTS

| 3,953,276 A | * | 4/1976 | Glorioso et al. ....... 156/345.17 |
| 4,510,176 A | * | 4/1985 | Cuthbert et al. ............ 438/780 |
| 6,247,479 B1 | * | 6/2001 | Taniyama et al. .......... 134/95.2 |
| 6,436,193 B1 | * | 8/2002 | Kasai et al. ................. 118/715 |
| 6,506,689 B2 | * | 1/2003 | Rolfson ...................... 438/759 |
| 6,551,488 B1 | * | 4/2003 | Hey et al. ................... 205/157 |
| 6,669,809 B2 | * | 12/2003 | Hashimoto et al. ...... 156/345.2 |

FOREIGN PATENT DOCUMENTS

| JP | 63-190679 | | 8/1988 |
| JP | 64-61917 | | 3/1989 |
| JP | 4-206626 | | 7/1992 |
| JP | 11-40557 | | 2/1999 |
| JP | 2948055 | | 7/1999 |
| JP | 11260702 | * | 9/1999 |

* cited by examiner

*Primary Examiner*—P. Hassanzodel
*Assistant Examiner*—Sylvia R. MacArthur
(74) *Attorney, Agent, or Firm*—Crowell & Moring LLP

(57) ABSTRACT

An edge remover is provided in the vicinity of an edge portion of a wafer subjected to copper plating. An aqueous hydrogen peroxide is supplied to the edge portion of the wafer from a first nozzle provided at an inner side for a radial direction of the wafer. Next, diluted hydrofluoric acid is supplied to the edge portion of the wafer from a second nozzle provided at an outer side for the radial direction thereof.

27 Claims, 18 Drawing Sheets

PROCESSING APPARATUS, PROCESSING SYSTEM AND PROCESSING METHOD

BACKGROUND OF THE INVENTION

1. Field of the Invention

The present invention relates to a processing apparatus, a processing system and a processing method for processing an edge at a substrate to remove a thin film of the edge of the substrate.

2. Description of the Related Art

An electronic device manufacturing process includes a step for forming a thin film on a substrate such as a semiconductor wafer, for example, a step for forming a resist film, a metal film and the like on the semiconductor wafer. The resist film is formed by resist coating, and the metal thin film is formed by plating. The substrate having the thin film thus formed is subjected to other processing such as etching, and the like.

In connection with the substrate subjected to the resist coating or plating, a thin film is also formed at an edge portion of the substrate. In some cases, the thin film of the edge portion is peeled and scattered by contact to a transfer mechanism during transferring substrate, and the scattered thin film is adhered onto the substrate, resulting in a defective product.

Particularly, in a copper plating step for forming a copper thin film as a wiring layer, since copper has a great influence upon silicon, the characteristic of the device extremely deteriorates when the thin film is adhered to the device area of the substrate. Thus, the thin film of the edge portion of the substrate causes reduction in yield.

In order to improve yield, as a method for removing the resist film from the edge portion of the substrate, there is known a method in which a process solution (resist solvent) is supplied to the edge portion of the substrate having the resist film formed to dissolve the resist thin film of the edge portion to remove the resist film. For example, Unexamined Japanese Patent Application KOKAI Publication No. S63-190679 and Unexamined Japanese Patent Application KOKAI Publication No. H4-206626 disclose a removing device comprising an edge portion washing member with a solvent supply nozzle. Moreover, Unexamined Japanese Patent Application KOKAI Publication No. S64-61917 and Japanese Patent No. 2948055 disclose a removing device comprising an edge portion washing member with a solvent supply nozzle and an exhaust solution sucking pipe.

Still moreover, Unexamined Japanese Patent Application KOKAI Publication No. H11-40557 discloses a device that supplies solvent to dissolve and remove a glass thin film of an edge portion by supplying solvent to the surface side.

While the target according to the above methods is the resist film or the glass film, the thin film formed by plating is made of metal. In order to remove the plated thin film, chemical processing with acid, alkaline, and the like is needed, and the method for simply dissolving the thin film in the process solution cannot be simply applied to the removal of the plated thin film. Thus, in conventional, there was no method in which the plated thin film formed at the edge portion of the substrate could be removed efficiently.

SUMMARY OF THE INVENTION

With consideration given to the above-mentioned problem, it is an object of the present invention to provide a processing apparatus, a processing system and a processing method, capable of processing an edge of the substrate efficiently.

Other object of the present invention is to provide a semiconductor substrate processing apparatus, a processing system and a processing method, capable of processing an edge of the substrate efficiently.

In order to attain the above object, according to the present invention, there is provided a processing apparatus comprising a holding member which holds and rotates said target a first nozzle which supplies a first process solution to an edge portion of one surface of said target in a state that said holding member is holding and rotating said target a second nozzle which supplies a second process solution to the edge portion of one surface of said target, to which surface said first nozzle supplies said first process solution and a sucking hole provided in the vicinity of the edge portion of said target, which sucks a discharge solution of said first process solution and said second process solution.

BRIEF DESCRIPTION OF THE DRAWINGS

These objects and other objects and advantages of the present invention will become more apparent upon reading of the following detailed description and the accompanying drawings in which.

DETAILED DESCRIPTION OF THE PREFERRED EMBODIMENTS

First Embodiment

An explanation will be given of the processing apparatus of the first embodiment with reference to the drawings accompanying herewith. The processing apparatus of the first embodiment structures a part of the plating apparatus that provides plating to a semiconductor wafer (hereinafter referred to as wafer).

Figure 1:
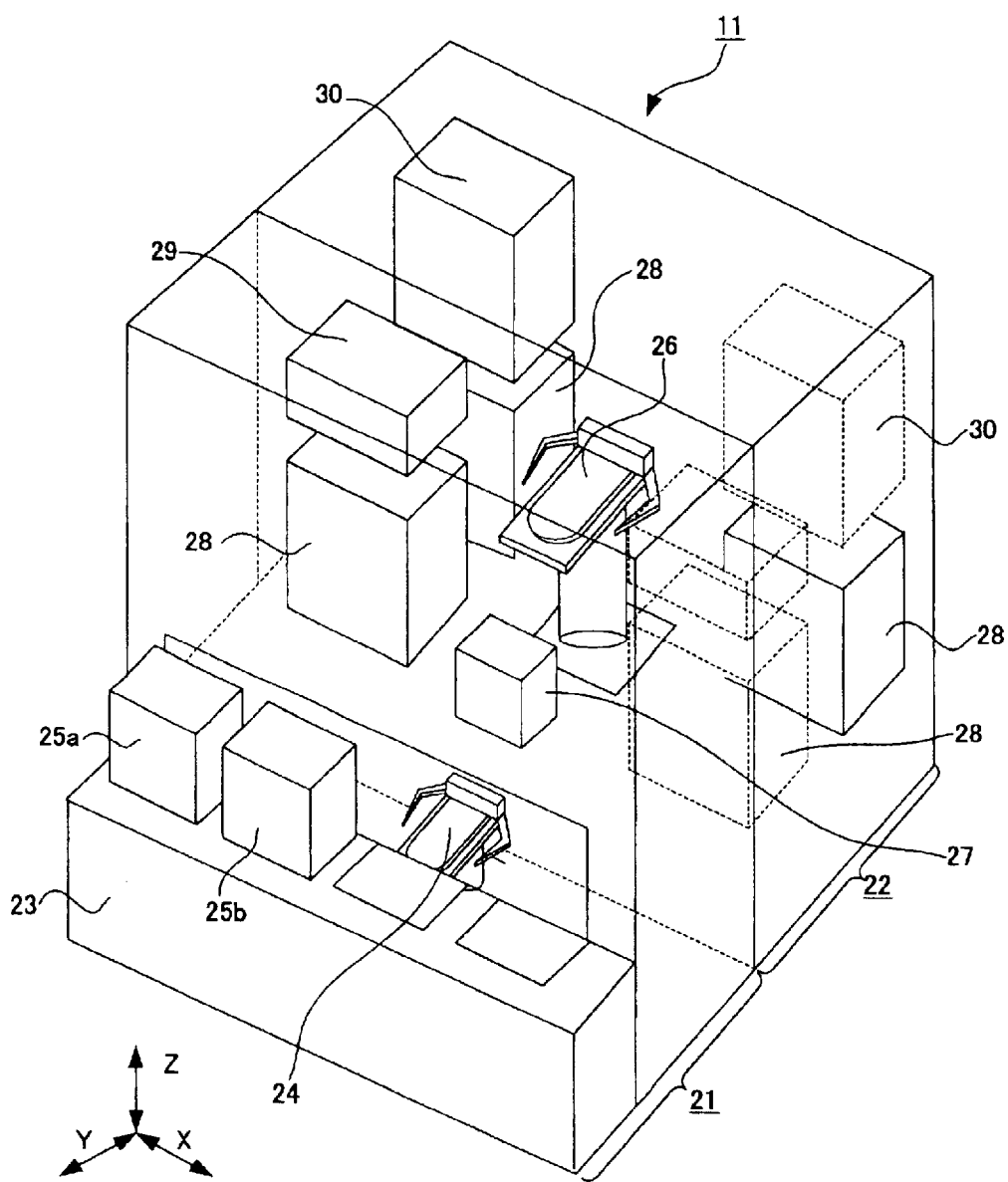
FIG. 1 is a three-dimensional cubic diagram illustrating a plating apparatus according to a first embodiment of the present invention.
Figure 2:
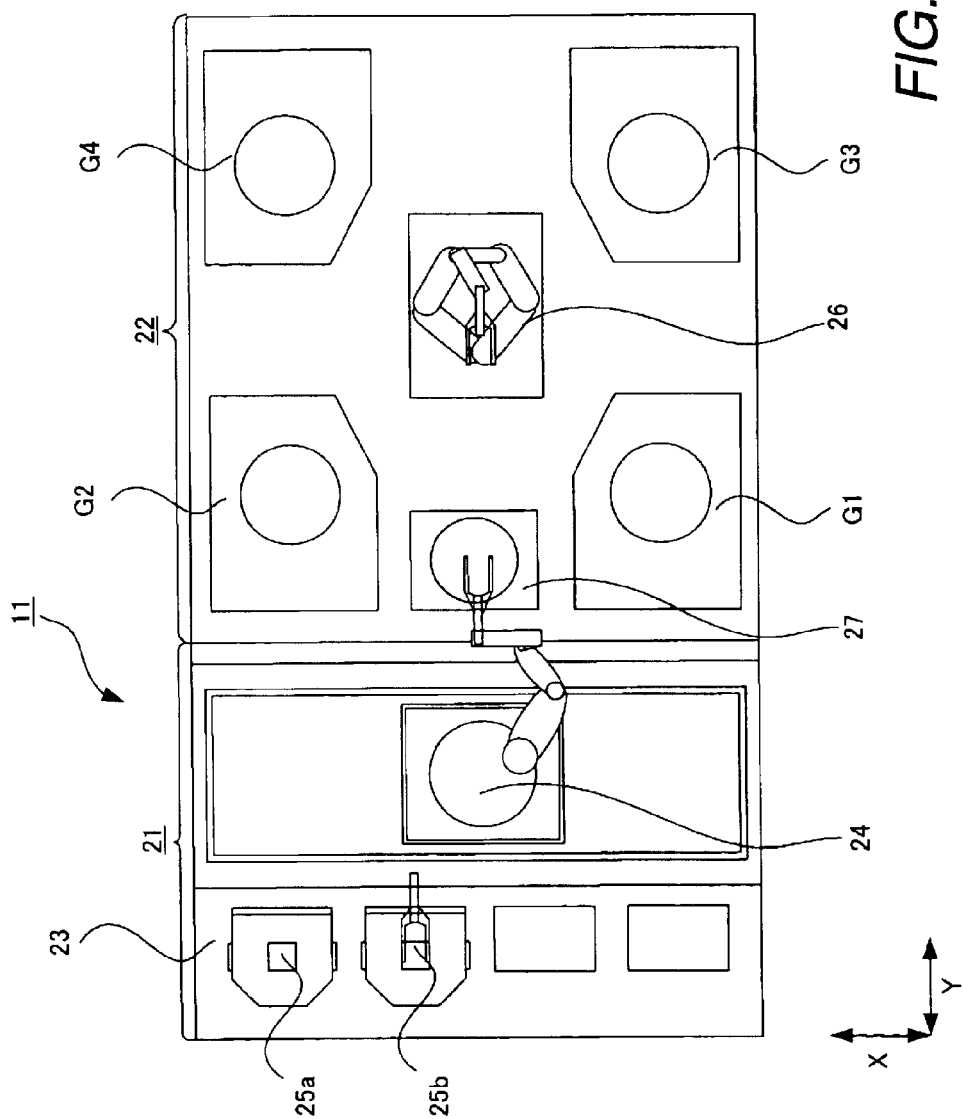
FIG. 2 is a plane view illustrating the structure of the plating apparatus according to the first embodiment.
Figure 3:
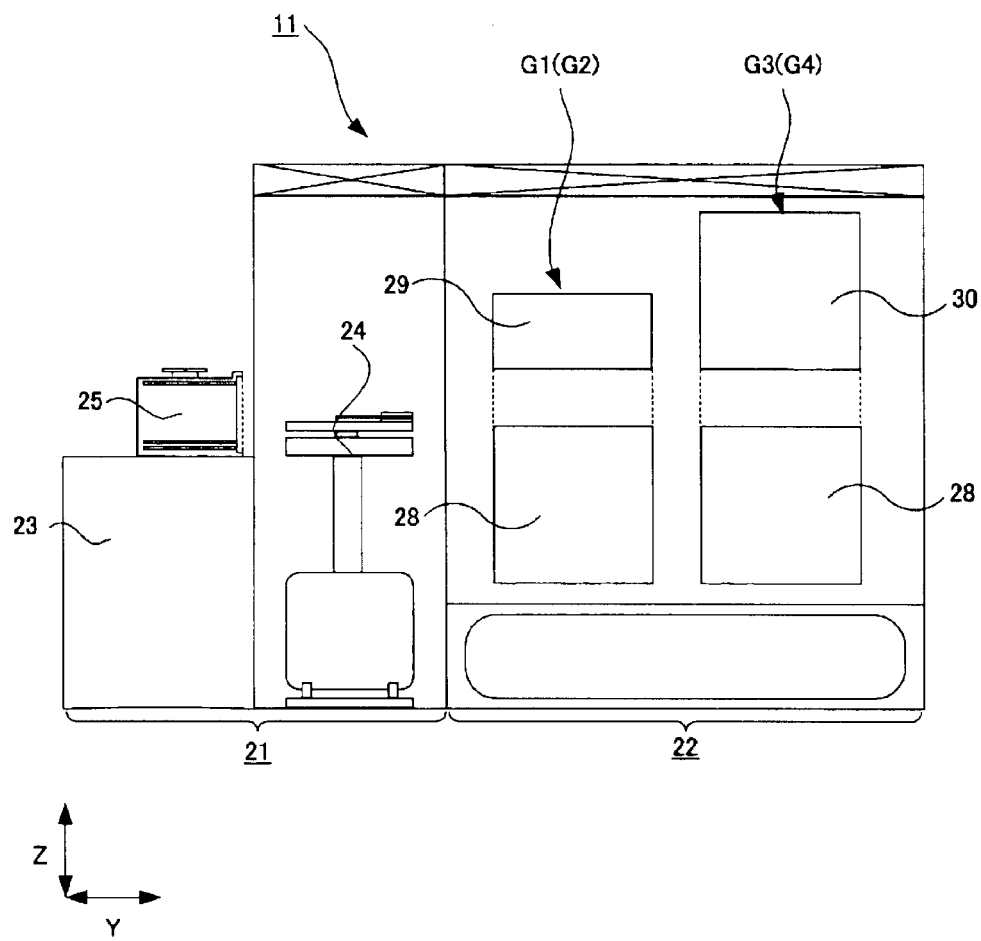
FIG. 3 is a side view illustrating the structure of the plating apparatus according to the first embodiment.

FIGS. 1 to 3 are views illustrating the structure of a plating apparatus 11 according to the first embodiment of the present invention, FIG. 1 is a three-dimensional cubic diagram, FIG. 2 is a plane view, and FIG. 3 is a side view.

As illustrated in FIG. 1, the plating apparatus 11 is composed of a cassette station 21 and a processing station 22.

The cassette station 21 has a cassette table 23, and a first transfer mechanism 24. The loading/unloading of wafer between the plating apparatus 11 and the outer section is performed through the cassette station 21. In the cassette station 21, the loading/unloading is performed for each of cassettes 25 containing a plurality of wafers.

On the cassette table 23, a plurality of wafer cassettes 25, for example, four wafer cassettes may be mounted in an X-axial direction. On the cassette table 23, a wafer cassette 25a, which contains a wafer to be plated, and a wafer cassette 25b, which contains a wafer subjected to plating, are mounted.

The first transfer mechanism 24 is structured to be movable in an X-axial direction, and accessible to all wafer cassettes 25 on the cassette table 23. Also, the first transfer mechanism 24 is structured to be rotatable around a z-axis and such that the delivery of wafer between the cassette station 21 and the process station 22 can be performed. Namely, the transfer mechanism 24 loads the wafer to be plated, to the process station 22 from the wafer cassette 25 mounted on the cassette table 23, and carries the wafer subjected to plating into the wafer cassette 25b on the cassette table 23.

As illustrated in FIG. 2, the process station 22 has a second transfer mechanism 26 at the center, and a plurality of pairs G1 to G4 of process units are provided around the second transfer mechanism 26 in a multi-stage manner. A wafer table 27 is also provided between the cassette station 21 and the process station 22.

With reference to FIG. 3, the first pair G1 and the second pair G2 each is composed of an upper plating unit 28 and a lower washing unit 29. While, the third pair G3 and the fourth pair G4 each is composed of a lower plating unit 28 and an upper extra unit 30. Thus, the plating apparatus 11 comprises four plating units 28 at the lower stage and two washing units and two extra units 30 at the upper stage.

The plating unit 28 provides plating to the wafer to form a thin film of, for example, copper (Cu) on the wafer. On the wafer loaded to the plating apparatus 11, a copper seed layer is already formed by sputtering, and the plating unit 28 forms a copper thin film on the seed layer.

The washing unit 29 washes the wafer subjected to plating with a washing solution such as chemical, pure water, and the like. More specifically, the washing unit 29 removes copper adhered onto the back surface of the wafer and the edge with a chemical solution, and washes the entirety of the wafer with pure water. After washing, the wafer is rotated under purge of nitrogen ($N_2$) at high speed for drying.

The extra unit 30 refers to other process unit, which can be paired with the plating unit 28 and the washing unit 29, for example, an annealing unit that performs annealing after plating. Alternately, one extra unit 30 may be used as plating unit 28 and the other may be used as washing unit 29.

The second transfer mechanism 26 is rotatable around the z-axis and movable up and down in the z-axial direction in such a way as to be accessible to the respective process units 28 to 30 provided in the multi-stage manner in the process station 22.

The second transfer mechanism 26 performs the delivery of wafer in the process station 22. On a wafer table 27, the wafer carried from the cassette station 21 is mounted by the first transfer mechanism 24. The second transfer mechanism 26 receives the wafer mounted on the wafer table 27 and transfers it to the plating unit 28. The second transfer mechanism 26 further transfers the wafer subjected to plating to the washing unit 29.

The second transfer mechanism 26 sends the washed wafer to the wafer table 27, and the first transfer mechanism 24 received it and stores in the wafer cassette 25a. It is noted that the first transfer mechanism 24 may directly receive the wafer from the washing unit 29 without passing through the wafer table 27.

The second transfer mechanism 26 has, for example, three arms. Among three arms, one may be used to transfer the wafer to the plating unit 28 from the wafer table 27, other may be used to transfer the wafer to the washing unit 29 from the plating unit 28, and other may be used to transfer the wafer to the wafer table 27 from the washing unit 29. This makes it possible to minimize contamination caused by the particles (copper thin film), chemical solution, and the like when the second transfer mechanism 26 transfers the wafer.

At the top portion of the cassette station 21 and the process station 22, an air supply device is provided, and the interior of each station is maintained clean by down flow of the clean air.

Figure 4:
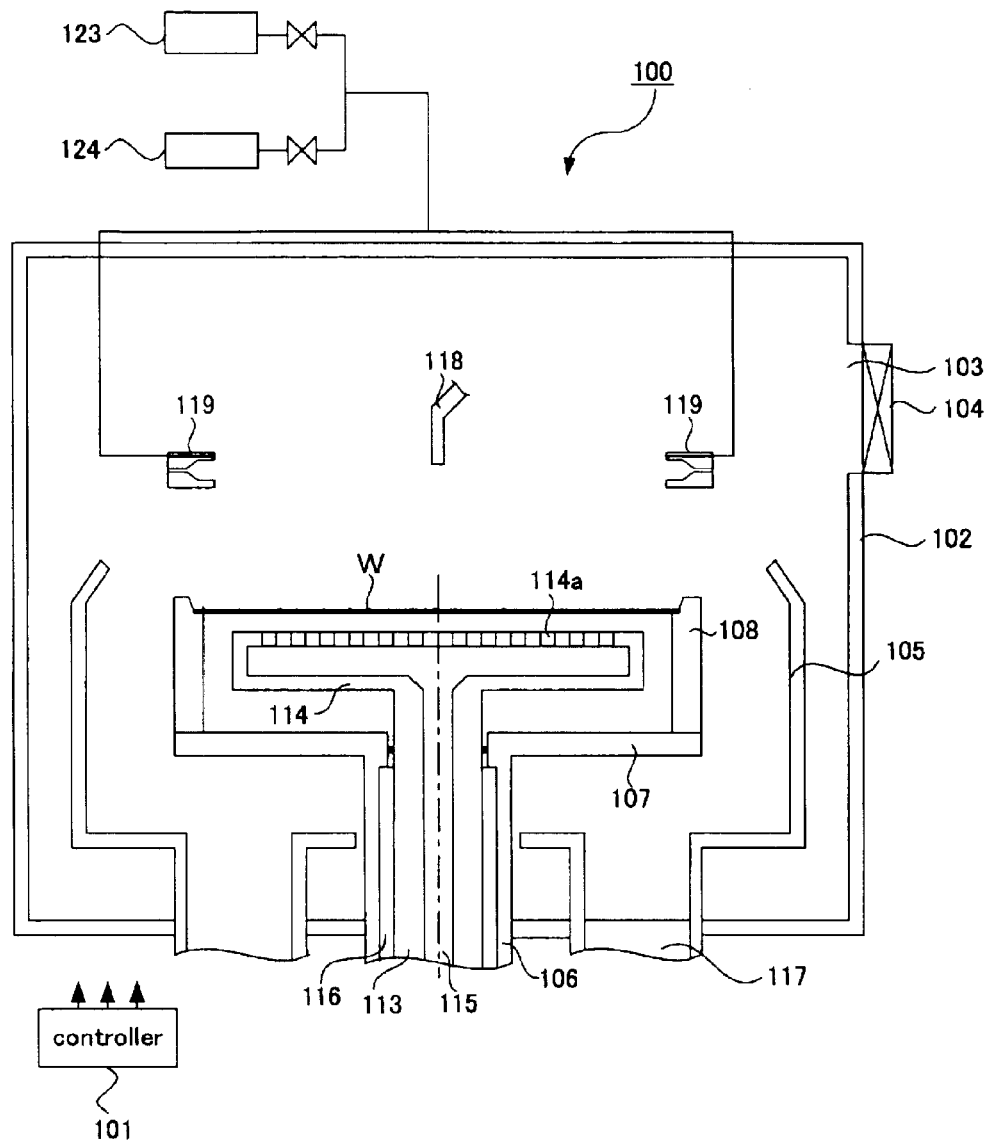
FIG. 4 is a view illustrating the structure of the processing apparatus according to the first embodiment.

The following will explain the processing apparatus (washing apparatus) that forms the washing unit 29. FIG. 4 illustrates the structure of a washing apparatus 100 of the first embodiment.

The washing apparatus 100 is controlled by a control section 101. The controller 101 is composed of an arithmetic processing unit and ROM that stores a processing program, and controls the overall operation of the washing apparatus 100. It is noted that the controller 101 may control the entirety of the plating apparatus 11. Regarding the operation of the controller 101, the explanation will be omitted hereinafter to understand the entirety easily.

The washing apparatus 100 has a square housing 102. The housing 102 has a gate 103. Gate 103 has a gate valve 104. At the center of the interior of the housing 102, there is provided a substantially cylindrical cup 105 whose upper surface is opened.

At the central position of the cup 105, a shaft 106 is provided. The shaft 106 is movable up and down and rotatable by a motor. At the upper portion of the shaft 106, a rotation table 107 is provided. On the rotation table 107, the wafer carried by the second transfer mechanism 26 is mounted.

Figures 5A, 5B:
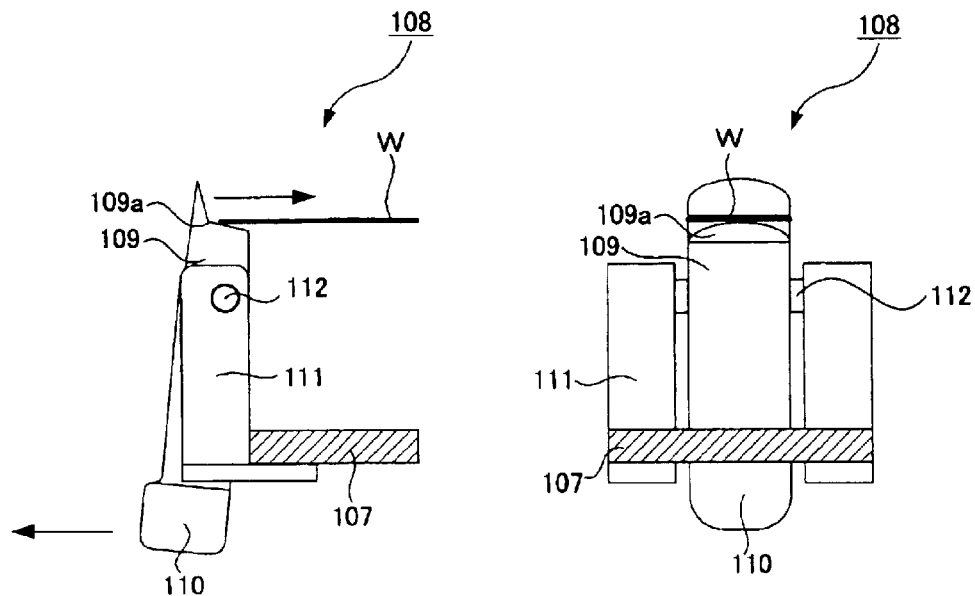
FIG. 5A is a side view of wafer holding members.
FIG. 5B is a front view thereof.

At the rotation table 107, a plurality of holding members 108 for holding the wafer W is provided. The structure of the holding members 108 is illustrated in FIG. 5A and 5B. FIG. 5A and 5B show a side view and a front view of the holding member 108, respectively. As illustrated in FIG. 5A and 5B, a holding portion 109 at the upper side and a plumb section 110 at the lower side are integrally formed. The holding portion 109 has a step 109a at its upper end and the wafer W is held by the step 109a. The holding portion 109 is connected to a support member 111 at a rotation center 112. The holding members 108 are rotatable around the rotation center 112. The weight of plumb section 110 is set to be heavier than that of the holding portion 109 and the plumb section 110 functions as a plumb bob for holding members 108.

Though the rotation table 107 rotates in accordance with the rotation of shaft 106 at a washing operation time, the wafer W must be held in stable during rotation. For this reason, the holding members 108 are structured in such a way that the edge portion of the wafer W is held by centrifugal force applied to not only the step 109a of the holding portion 109 but also the plumb section 110.

Namely, the wafer W is mounted on the holding members 108 in a state that no rotation occurs, and is held by the holding portion 109. Then, when the rotation table 107 rotates, the plumb section 110 is intended to further move outward by centrifugal force acting on the plumb section 110. As a result, the holding portions 109 of the holding members 108 are pressed to the center of the rotation table 107, so that the wafer W is held firmly.

Back to FIG. 4, a lifter 113 is provided to pass through the interior of the shaft 106. A lift plate 114 is fixed to the upper portion of the lifter 113. The lift plate 114 has a hollow in its interior, and a plurality of holes 114a connect to the hollow on its surface. The hollow communicates with a pipe 115 passing through the interior of the lifter 113. The pipe 115 is connected to a pump. The wafer W mounted on the lift plate 114 is sucked and fixed to the lift plate 114 by sucking of the pump.

The lifter 113 is movable up and down and rotatable by a motor. The lifter 113 is placed below wafer W at the time of loading/unloading the wafer W. Also, at the time of washing the wafer W, the lifter 113 moves upward until the lift plate 114 comes in contact with the wafer W. The wafer W contacting the lift plate 114 is sucked and fixed to the lift plate 114 as mentioned above.

The pipe 115 passing through the hollow of the lift plate 114 is also connected to a bath of pure water or nitrogen ($N_2$) gas, and is structured such that pure water or nitrogen gas flows therein. Pure water or nitrogen gas is supplied upwardly from the plurality of holes 114a formed on the surface of the lift plate 114.

A gas channel 116 is formed in a space between the shaft 106 and the lifter 113, and an inert gas such as nitrogen gas is circulated therein. The inert gas flowing in the gas channel 116 is sent to the edge of the rotation table 107 along the surface of the rotation table 107.

The inert gas flows in the edge direction from the center of the rotation table 107 during rotation of the lifter 113, and blows upwardly from the edge of the rotation table 107, that is, a portion in the vicinity of the edge portion of the wafer W. For this reason, it is possible to prevent particles and the like from adhering to the back surface of the wafer W.

Below the cup 105, an exhaust hole 117, which is connected to a pump, is provided, and exhaust gas containing waste solution such as washing solution flows thereto.

Figure 6:
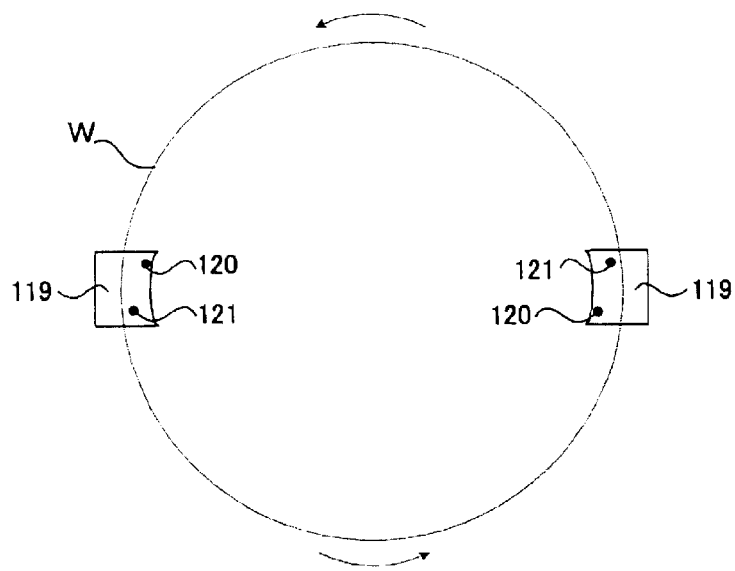
FIG. 6 is a view illustrating the placement of an edge remover.

At the upper portion of the rotation table 107, a main washing nozzle 118 and an edge remover 119 are provided. The main washing nozzle 118 is connected to the bath of pure water or nitrogen gas, and pure water or nitrogen gas can be supplied to the surface of the wafer W from the main washing nozzle 118. As illustrated in FIG. 6, two edge removers 119 are provided to be opposed to each other in the vicinity of the edge of the wafer W.

Figure 7:
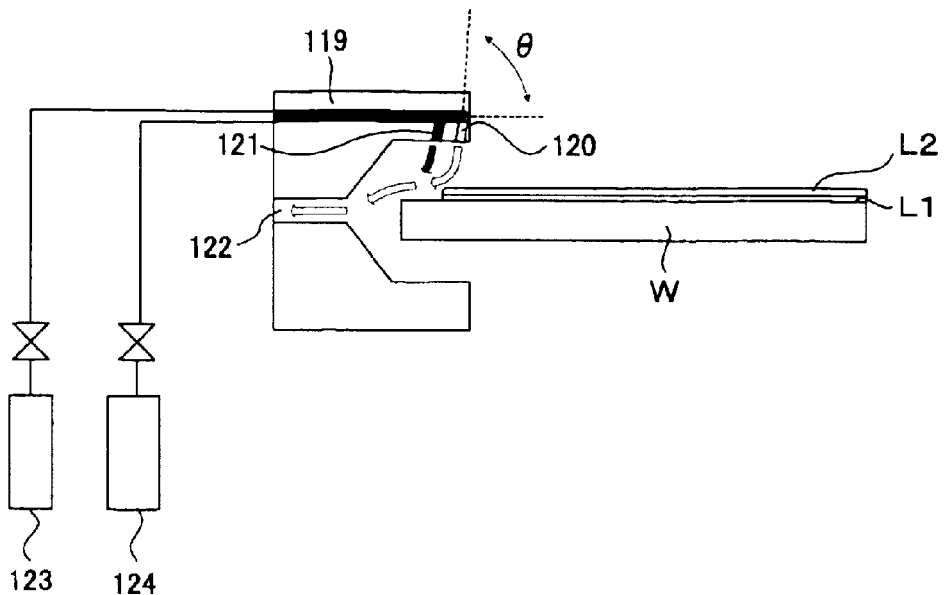
FIG. 7 is a view for explaining a wafer edge washing method.

As illustrated in FIG. 7, the edge remover 119 has a U-shape portion, and is structured to sandwich the end portion of the wafer W at the U-shape portion. Then, a first nozzle 120 and a second nozzle 121 are embedded in the surface of the U-shape portion opposing to the main surface of the wafer W. Moreover, a suction hole 122 is provided at the central portion of the U-shape portion of the edge remover 119, and the suction hole 122 is connected to the pump and the like and sucked, and connects to a waste solution reservoir.

The first nozzle 120 connects to a first tank 123 in which an aqueous hydrogen peroxide ($H_2O_2$) is reserved, so that the aqueous hydrogen peroxide can be supplied to the edge portion of the wafer W. The second nozzle 121 connects to a second tank 124 in which diluted hydrofluoric acid is reserved. As a chemical solution discharged from the second nozzle 121, acids such as inorganic acid such as hydrochloric acid, sulfuric acid and the like, or, organic acid other than hydrofluoric acid can be used.

As illustrated in FIG. 7, on the surface of the wafer W, a copper seed layer L1 and a copper wiring layer L2 formed on the seed layer L1 are present. The remover 119 discharges aqueous hydrogen peroxide and diluted hydrofluoric acid to the edge portion of the rotating wafer W from the first nozzle 120 and the second nozzle 121, respectively, and mixes these chemicals at the edge of wafer W to wash the edge portion of wafer W (removal of copper thin film).

At the time of washing, the dissolved thin film and the unreacted chemical solutions are sucked to the suction hole 122 and flow into the waste solution reservoir. Accordingly, the dissolved thin film and the unreacted chemical solutions are prevented from being scattered to the device area of the wafer W.

Figure 8:
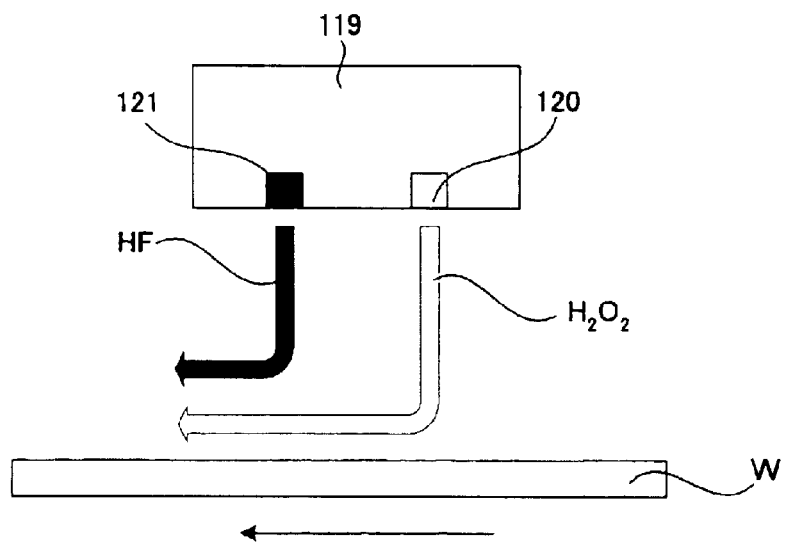
FIG. 8 is a view for explaining a wafer edge washing method.

As illustrated in FIG. 8, the first nozzle 120 is placed at the upper stream from the second nozzle 121 with respect to the rotation direction of the wafer W. The washing (etching) of the edge of the wafer W is performed using the chemical reaction of a mixture of the aqueous hydrogen peroxide and the diluted hydrofluoric acid with copper. Then, the aqueous hydrogen peroxide with low activity against copper is discharged from the first nozzle 120 at the upstream in the rotation direction of the wafer W. In the state that the aqueous hydrogen peroxide covers in the edge of the wafer W, hydrofluoric acid solution is supplied. This makes it possible to perform etching of the edge of the wafer W with a desired washing width, for example, around 2 mm as preventing excessive etching of the seed layer L and wiring layer L2.

Moreover, as illustrated in FIG. 6, the first nozzle 120 is provided closer to the center of the rotation of the wafer W than the second nozzle 121. This makes it possible to supply the diluted hydrofluoric acid solution onto the flow of the aqueous hydrogen peroxide even if the aqueous hydrogen peroxide discharged from the first nozzle 120 flows in the centrifugal direction of the wafer W by centrifugal force caused by the rotation of the wafer W.

Still moreover, as illustrated in FIG. 7, an injection angle θ of the first nozzle 120 and that of the second nozzle 121 with respect to the main surface of the wafer W are 0 to 90° in order to obtain a desired washing width. Particularly, when the injection angle θ is acute, it is possible to prevent the chemical solution and the like from being scattered to the device area of wafer W.

The main parts of the processing apparatus (washing apparatus) 100 according to the first embodiment are structured as mentioned above. The following will explain the washing sequence.

First, the first transfer mechanism 24 loads the wafer W to the plating apparatus 11 from the wafer cassette 25a and mounts the wafer W on the wafer table 27. The second transfer mechanism 26 loads the wafer on the wafer table 27 to the plating unit 28. The second transfer mechanism 26 unloads the wafer W subjected to plating from the plating unit 28 and sends it to the washing unit 29.

The second transfer mechanism 26 holding the wafer W subjected to plating accesses from the gate 103 and advances up to the position above the rotation table 107. In this state, the shaft 106 actuates and the rotation table 107 rises. Here, the second transfer mechanism 26 mounts the wafer W on the rotation table 107, and the wafer W is held by the holding members 108. At this time, the wafer W is mounted thereon in the state that the plated surface thereof directs downward.

After that, the shaft 106 moves down to the lowest position, with the result that the entirety of the rotation table 107 is contained in the cup 105. In this state, the lifter 113 rises, and the wafer W is mounted on the lift plate 114. At this time, the wafer W is sucked to the lift plate 114 through the holes 114a formed at the surface of the lift plate 114, and is fixed. In this state, the lift 113 starts rotating.

Figure 9:
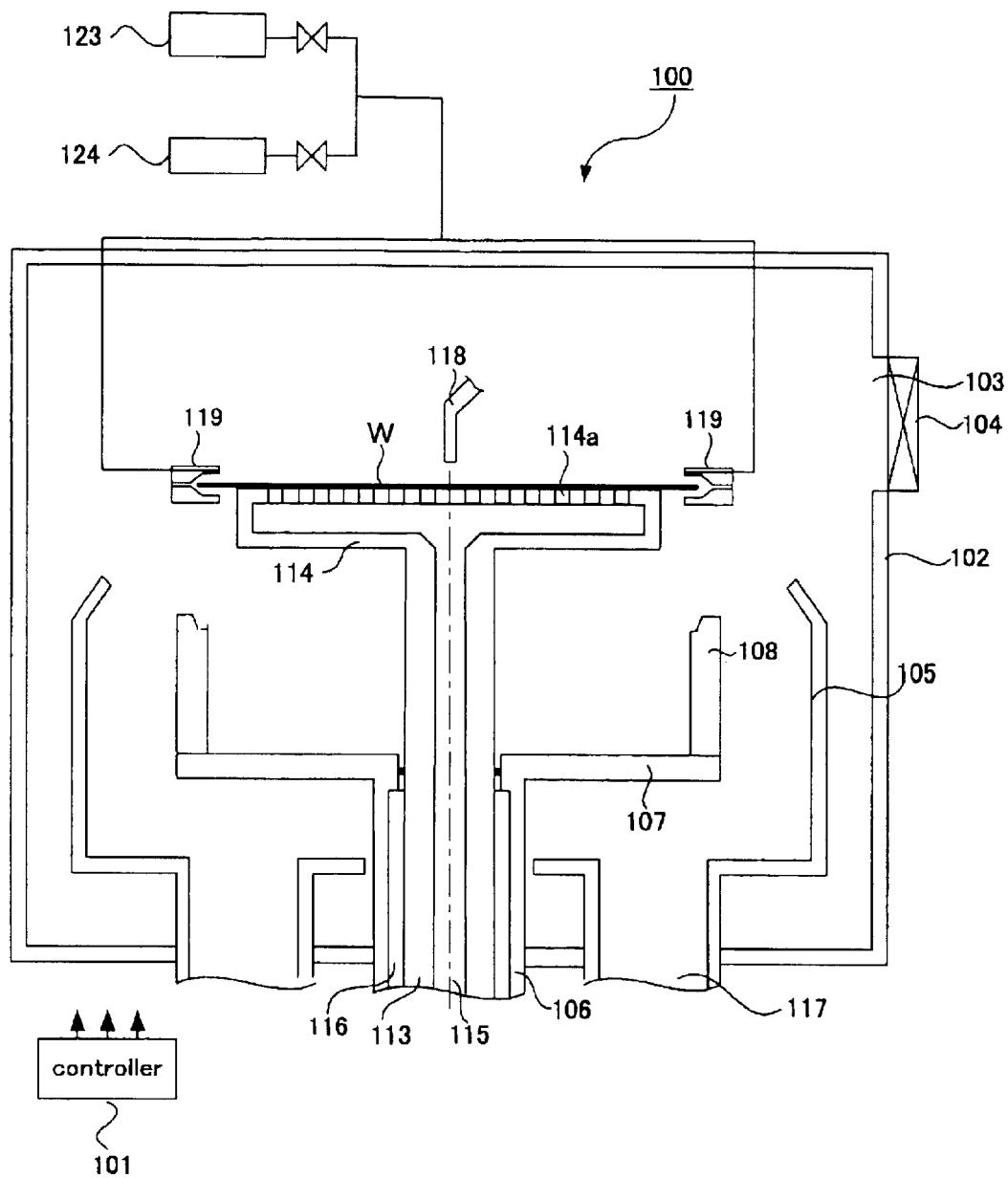
FIG. 9 is a view illustrating the structure of the processing apparatus at the time of washing the wafer edge.

After that, when the second transfer mechanism 26 moves to the outside of the washing unit 29, the lift plate 114 further rises and maintains the wafer W at a given height. In this state, as illustrated in FIG. 9, the edge remover 119 moves to the position close to the edge of the wafer W. Thereafter, as mentioned above, the aqueous hydrogen peroxide is discharged from the first nozzle 120 of the edge remover 119 and the diluted hydrofluoric acid solution is discharged from the second nozzle 121, so that the edge of the wafer W is washed (etched).

After the washing of the edge of the wafer W is completed, the rotation of the lifter 113 is stopped, and the edge remover 119 moves to be separated from the surroundings of the wafer W. At this time, the suction of the wafer W to the lift plate 114 is released. After that, the lifter 113 moves down to the lowest position. When the lifter 113 moves down, the wafer W mounted on the lifter 113 is held by the holding members 108 of the rotation table 107.

At this time, since the rotation table 107 is not in a rotatable state, the holding portions 109 of the holding members 108 are maintained substantially vertically as mentioned above, with the result that the rotation table 107 does not perform such a motion that presses the end portion of the wafer W. For this reason, the wafer W held by the holding members 108 is simply mounted, and the wafer W is in a state that it can be easily lifted if a perpendicular and upward force acts on the wafer W by the lifter 113.

Next, pure water is supplied from the main washing nozzle 118 provided at the upper portion of the wafer W as rotating the rotation table 107 on which the wafer W is mounted so as to wash the upper surface of the wafer W. At this time, the rotation of the rotation table 107 causes the holding members 108 to apply a radial and inward pressing force to the wafer W, with the result that the wafer W is firmly fixed to the rotation table 107.

After the completion of washing the upper surface of the wafer W, the washing solution (chemical solution) is supplied to the pipe 115 passing through the lifer 113. The washing solution is supplied to the lower surface of the wafer W through the plurality of holes 114a of the lift plate 114 to wash the lower surface of the wafer W. Here, the washing of the lower surface may be performed concurrently with that of the upper surface.

After the completion of washing the lower surface of the wafer W, the supply of the washing solution is stopped. Then, the rotation table 107 is rotated at high speed to perform the drying of wafer W as purging the nitrogen gas from the main washing nozzle 118 and the plurality of holes 114a of the lift plate 114. After the end of drying, the rotation of the rotation table 107 is stopped, and the lifter 113 rises and lifts the washed wafer W up to a given position. The wafer W is unloaded to the outer section of the washing unit 29 by the second transfer mechanism 26.

The second transfer mechanism 26 mounts the washed wafer W on the wafer table 27. The first transfer mechanism 24 unloads the wafer on the wafer table 27 from the interior of the plating apparatus 11, and stores the wafer W in the wafer cassette 23b. Up to this point, the processing using the plating apparatus 11 ends.

Figure 10:
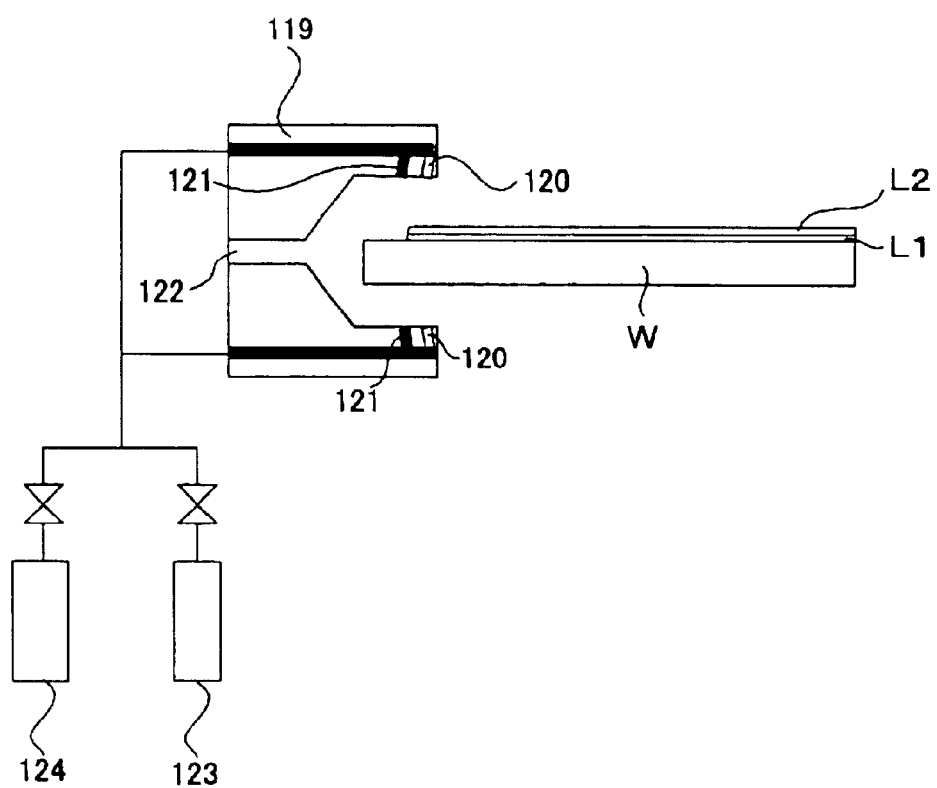
FIG. 10 is a view illustrating another edge remover according to a modified embodiment.

According to the aforementioned first embodiment, the edge remover 119 is provided the first nozzle 120 and the second nozzle 121 at only the plated surface side of the wafer W. However, as illustrated in FIG. 10, the similar nozzles may be provided at the lower surface side to supply the chemical solution to both surfaces of the edge portion of the wafer W. This makes it possible to remove the copper thin film formed of the lower surface of the wafer W by the plating. Related to this, washing process may be performed in state that the plated surface directs downward.

The first embodiment was structured such that the edge remover 119 had two nozzles 120 and 121, and the chemical solutions were discharged from the respective nozzles separately and mixed on the wafer W. However, the mixture of chemical solutions may be discharged from one nozzle. In this case, for example, the mixture of hydrofluoric acid: hydrogen peroxide: pure water=1:1:23 may be used.

The processing apparatus 100 of the first embodiment has the structure having the edge removers 119 at two locations. However, the structure having the edge removers 119 at three or more locations may be possible.

Instead of performing the washing process after rotating the wafer W by the fixed edge remover 119, such structure is possible that the edge remover 119 is rotated in a state that the substrate is fixed to perform washing process.

Second Embodiment

An explanation will be given of the processing apparatus of the second embodiment with reference to the drawings accompanying herewith. The processing apparatus of the second embodiment structures a part of the plating apparatus that provides plating to a semiconductor wafer as shown in FIGS. 1 to 3.

FIGS. 1 to 3 are views illustrating the structure of a plating apparatus 11 according to the first embodiment of the present invention, FIG. 1 is a three-dimensional cubic diagram, FIG. 2 is a plane view, and FIG. 3 is a side view.

Figure 11:
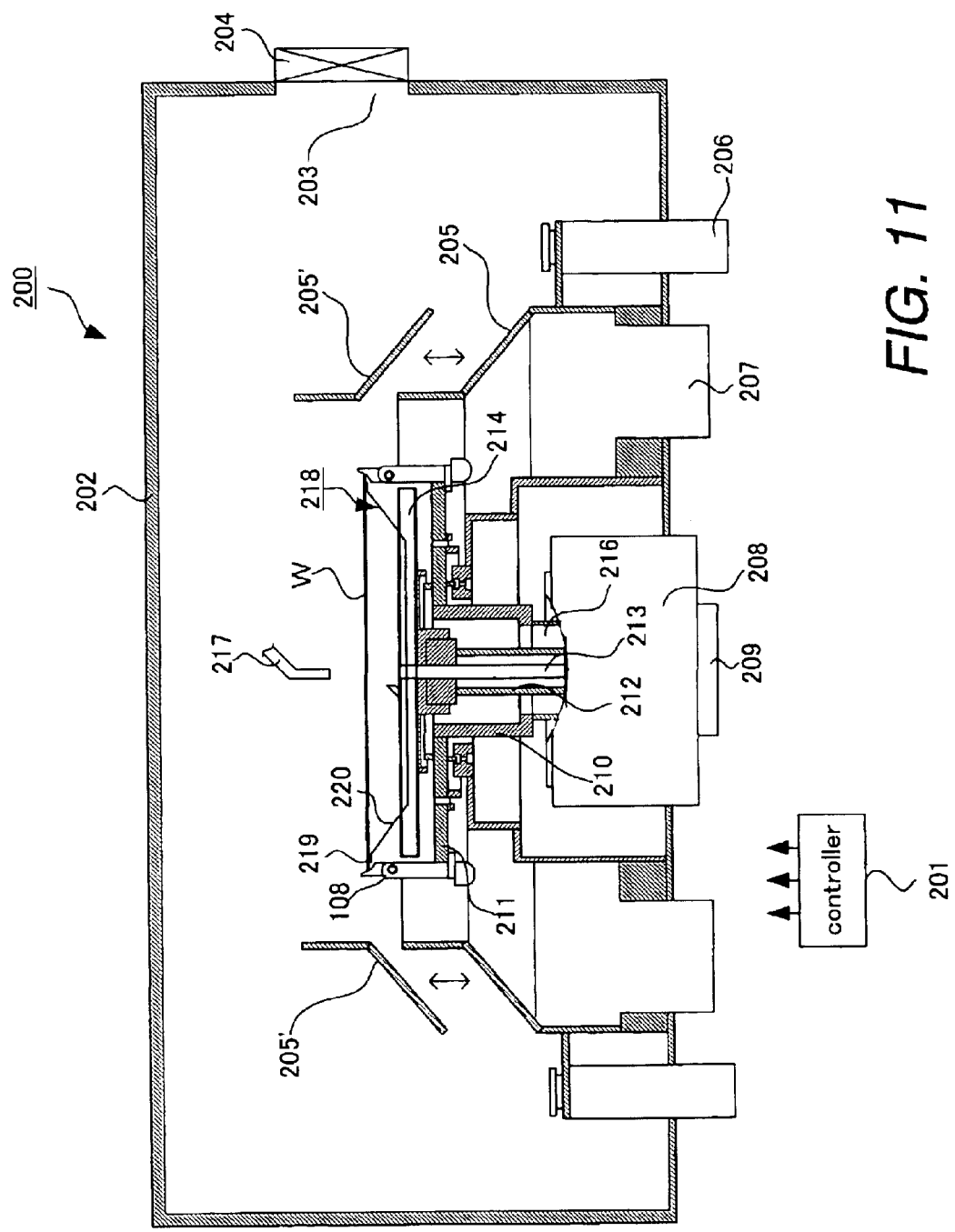
FIG. 11 is a view illustrating the structure of the processing apparatus according to a second embodiment.

The following will explain the processing apparatus (washing apparatus) that forms the washing unit 29. FIG. 11 illustrates the structure of a washing apparatus 200 of the second embodiment.

The washing apparatus 200 is controlled by a controller 201. The controller 201 is composed of an arithmetic processing unit and ROM that stores a processing program, and controls the overall operation of the washing apparatus 100. It is noted that the controller 201 may control the entirety of the plating apparatus 11. Regarding the operation of the controller 201, the explanation will be omitted hereinafter to understand the entirety easily.

The washing apparatus 200 has a square housing 202. The housing 202 has gates 203 at both sides. Each gate 203 has a gate valve 204. At the center of the interior of the housing 202, there is provided a substantially cylindrical cup 205 whose upper surface is opened. The cup 205 is movable up and down by a cup drive mechanism 206 such as a motor.

At the lower portion of the cup 205, an exhaust hole 207, which is connected to a pump, is provided, and exhaust gas containing waste solution such as washing solution flows thereto.

At the central position of the housing 202, a rotator 208 is provided. The rotator 208 is rotated at the given number of revolutions by the drive of a hollow motor 209. The rotator 208 is fixed to a first shaft 210. A rotation table 211 is fixed to the first shaft 210.

In the interior of the first shaft 210 of the rotator 208, a second shaft 212 is provided. In the interior of the second shaft 212, a pipe 213 is provided. The pipe 213 is connected to a tank of nitrogen gas and pure water, and the nitrogen gas and pure water flows alternately. A back surface washing nozzle 214 is also fixed onto the second shaft 212.

Figure 12:
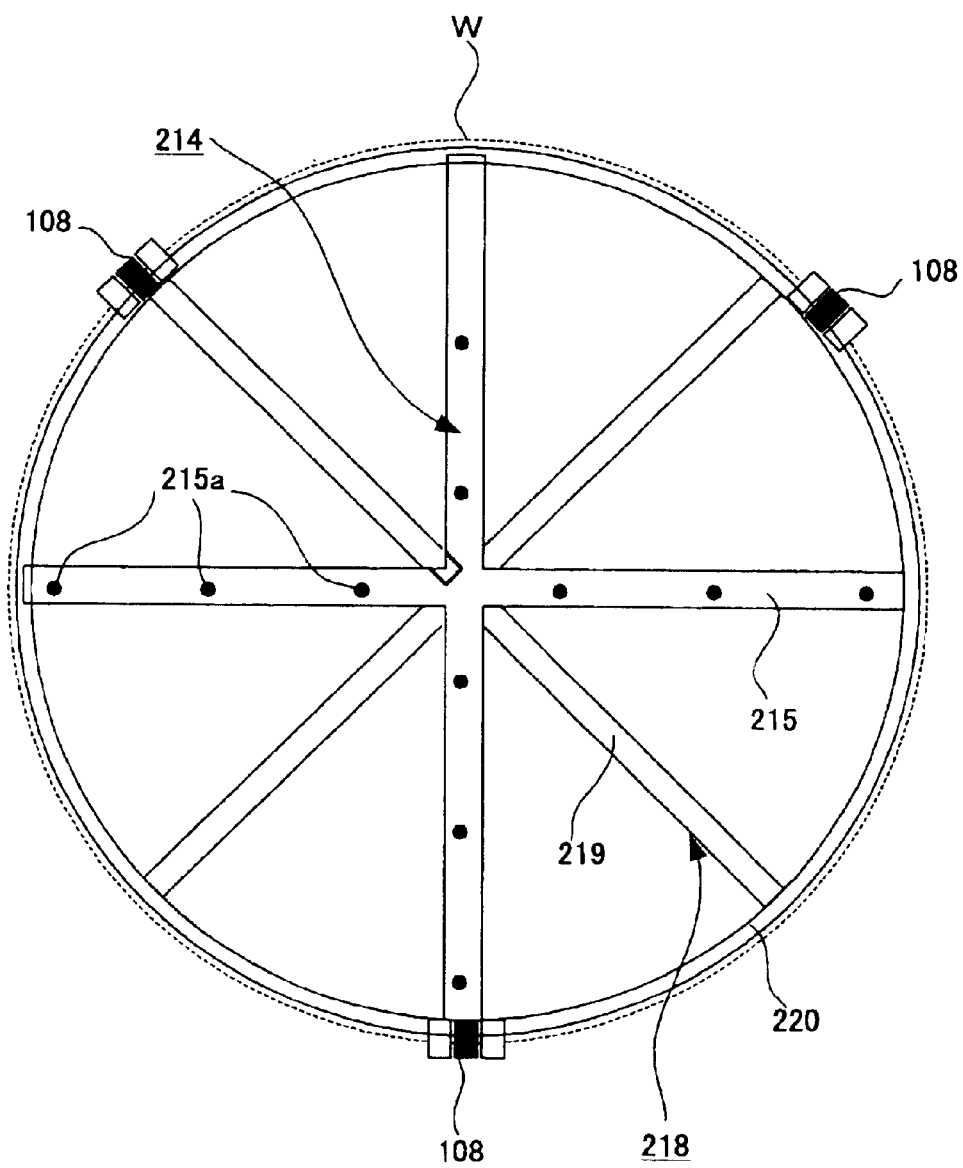
FIG. 12 is a view illustrating the placement of a rotation table.

FIG. 12 shows the plane view of the back surface washing nozzle 214. As illustrated in FIG. 12, the back surface washing nozzle 214 has four rod members 215, which intersect one another in the shape of a cross, and each rod member 215 extends to the edge of the rotation table 211 from the center fixed to the second shaft 212. The interior of the rod member 215 is hollow, and communicates with the pipe 213 passing through the interior of the second shaft 212. Pure water is supplied upward from holes 215a formed at the upper portion of the rod member 215 of the back surface washing nozzle 214 through the pipe 213.

The same holding members 108 as those of the first embodiment illustrated in FIG. 5 are respectively attached to the edge of the rotation table 211 at an angle of substantially 120° at regular intervals. The wafer is mounted on the rotation table 211 in a state that the plated surface directs downward, and is held by the holding members 108. The wafer W mounted on the holding members 108 is firmly fixed by centrifugal force when the rotation table 211 is rotating.

A gas channel 216 is formed in a space between the shaft 210 and the second shaft 212, and an inert gas such as nitrogen gas flows therein. The inert gas flows to the edge of the rotation table 211 along the surface of the rotation table 211 and blows upwardly from the edge portion of the rotation table 211, that is, a portion in the vicinity of the edge portion of the wafer W. For this reason, it is possible to prevent particles and the like from adhering to the back surface of the wafer W.

At the upper portion of the rotation table 211, a main washing nozzle 217 is provided. The main washing nozzle 217 connects to a washing solution tank, and discharges a chemical solution for washing reserved in the washing solution tank to the surface of the wafer W at a given rate. Here, the washing solution reserved in the washing solution tank is a mixture of inorganic acid such as hydrofluoric acid, hydrochloric acid, sulfuric acid or organic acid and an aqueous hydrogen peroxide ($H_2O_2$), for example, a mixture of diluted hydrofluoric acid and aqueous hydrogen peroxide. It is noted that diluted hydrofluoric acid and aqueous hydrogen peroxide may be respectively supplied from the different tank and mixed just before the main washing nozzle 217.

The main washing nozzle 217 is movable such that the top end of the nozzle comes to the upper portion of the center of the wafer W while the transfer of wafer W by the second transfer mechanism 26 is prevented when the wafer W is not mounted on the rotation table 211.

The second shaft 212 has a blocking member 218. As illustrated in FIG. 12, the blocking member 218 has a support section 219 composed of four plate members fixed to the second shaft 212 and a blocking plate 220 formed of a substantially circular plate member connected to the end of the support section 219. The blocking plate 220 has a radius substantially equal to the radius of the wafer, and is placed in the vicinity of the edge of the wafer W when the wafer W is mounted on the rotation table 211. Here, the blocking member 218 is made of resin having resistance to the washing solution, that is, diluted acid and aqueous hydrogen peroxide.

Figure 13:
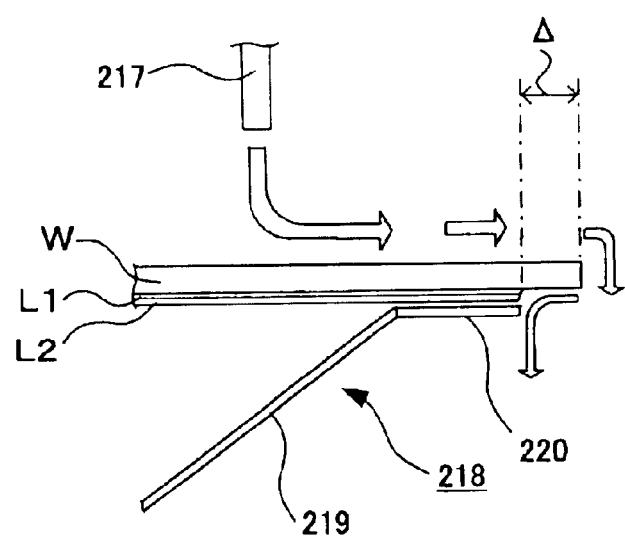
FIG. 13 is a view for explaining a wafer edge washing method.

As illustrated in FIG. 13, at the time of washing, the wafer W is mounted on the rotation table in the state that the plated surface directs downward. On the plated surface of the wafer W, a copper seed layer L1 and a copper layer L2 formed thereon are present. The washing (etching) of the back surface and the edge of the wafer W is carried out by discharging the washing chemical solution from the main washing nozzle 217 placed above the wafer W.

The blocking plate 220 is placed close to the edge of the wafer W and is substantially parallel to the plane of the wafer W. In this state, a gap between the wafer W and the blocking member 218 is extremely narrow, and the washing solution is subject to force towards the opposite direction to the center of the wafer W. This means that the washing solution, which is supplied from the main washing nozzle 217 and gets over to the lower surface of the wafer W, little get into the gap between the wafer W and the blocking member 218. Accordingly, the washing (etching) of only the edge portion of the wafer W can be selectively performed to prevent the washing solution from being scattered to the device area of the wafer W.

The difference in the horizontal distance of the outer end of the blocking plate 220 to the end of the wafer W is the width Δ to be washed. The arrangement of the blocking member 218 can adjust the washing width Δ to a desired width, for example, around 2 mm with high accuracy.

The main parts of the processing apparatus (washing apparatus) 200 according to the second embodiment are structured as mentioned above. The following will explain the washing sequence.

First, the first transfer mechanism 24 loads the wafer W to the plating apparatus 11 from the wafer cassette 25a and mounts the wafer W on the wafer table 27. The second transfer mechanism 26 loads the wafer on the wafer table 27 to the plating unit 28. The second transfer mechanism 26 unloads the wafer W subjected to plating from the plating unit 28 and sends it to the washing unit 29.

The second transfer mechanism 26 that has held the wafer W subjected to plating accesses from the gate 203 and advances up to the position above the rotation table 211. The second transfer mechanism 26 mounts the wafer W on the rotation table 211, and the wafer W is held by the holding members 108. At this time, the wafer W is mounted thereon in the state that the plated surface thereof directs downward.

After that, the second transfer mechanism 26 moves to the outside of the washing unit 29. At this time, the cup 205 placed at the lowest position rises up to the highest position 205'.

After the rise of the cup 205, the rotator 208 rotates by the hollow motor 209, and the rotation table 211 rotates in accordance with the rotation of the rotator 208. At this time, the wafer W rotates as being firmly fixed by the holding members 108.

After the number of revolutions of the rotation table 211 reaches a given value or on the way, the back surface washing nozzle 214 moves to the upper portion of the center of the wafer W. After that, pure water is supplied to the lower surface of the wafer W from the back surface washing nozzle 214, and sequentially the washing solution is supplied thereto from the main washing nozzle 217. This washes the back surface (opposite surface of the plated surface) and the edge thereof.

Thereafter, the number of revolutions of the rotation table 211 is increased up to a given value. At this time, the supply of the washing solution and that of pure water are stopped and nitrogen gas is supplied from the holes 215a of the main washing nozzle 217 and the back surface washing nozzle 214 placed at the lowest position. The wafer W is maintained in this state for a given time, and then the drying process of wafer W ends.

After the drying process, the rotation of the rotation table 211 is stopped. At this time, the fixation of wafer W by the holding members 108 using centrifugal force is released. After that, the cup 205 moves down to the lowest position. The wafer W is unloaded to the outer section of the washing unit 29 by the second transfer mechanism 26.

The second transfer mechanism 26 mounts the washed wafer W on the wafer table 27. The first transfer mechanism 24 unloads the wafer placed on the wafer table 27 from the interior of the plating apparatus 11, and contains the wafer W in the wafer cassette 23b. Up to this point, the processing using the plating apparatus 11 ends.

In the second embodiment, the washing solution, which was supplied from the main washing nozzle 217 and was getting over to the lower surface, was blocked using the blocking member 218. However, a structure in which similar effect can be obtained using fluid such as liquid and gas is possible.

Figure 14:
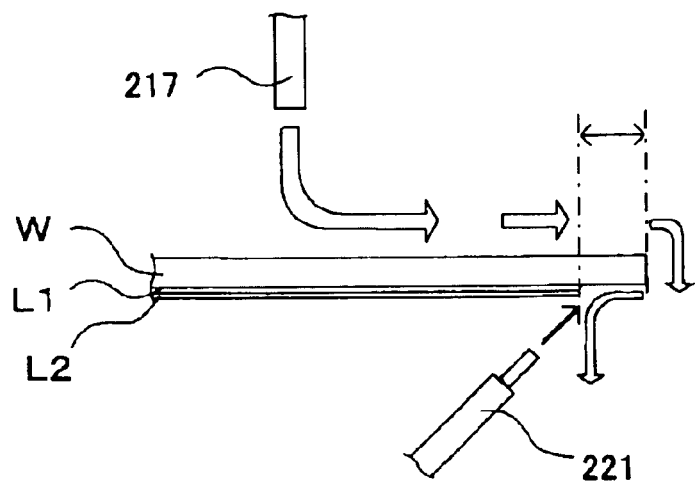
FIG. 14 is a view illustrating modification of blocking member.

FIG. 14 illustrates the structure in which the washing solution getting over to the lower surface of the wafer W is blocked by fluid. The washing apparatus 200 illustrated in FIG. 14 has a sub nozzle 221 for blocking the washing solution getting over to the lower surface of the wafer W in place of the blocking member 218. The sub nozzle 221 is fixed to the second shaft 212.

The sub nozzle 221 directs to the edge of the wafer W at an acute angle to the main surface. From the sub nozzle 221, an inert gas such as nitrogen or pure water is blown. This makes it possible to physically block the washing solution supplied from the main washing nozzle 217 to get over to the reverse surface of the wafer W by the fluid blown from the sub nozzle 221 as illustrated in FIG. 14. The washing width of the edge of the wafer W can be adjusted with high accuracy by the supply quantity of pure water or inert gas from the sub nozzle 221, an angle of injection, and the like.

According to the structure having the sub nozzle 221, the wafer W can be placed as the plated surface directs upwards. One example is illustrated in FIG. 15.

Figure 15:
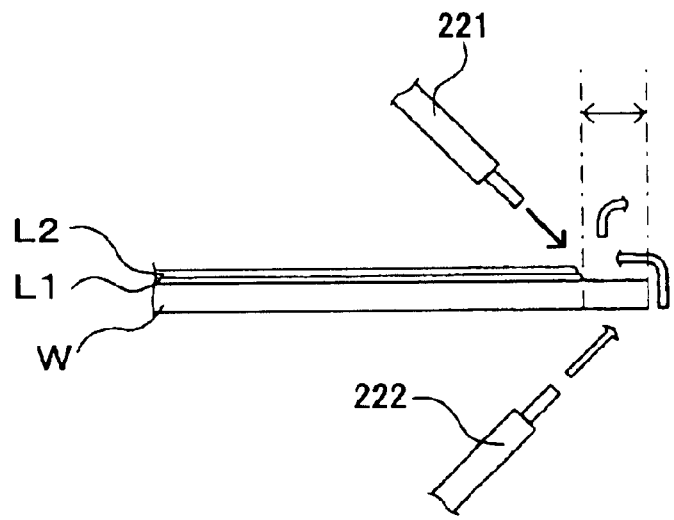
FIG. 15 is a view illustrating modification of blocking member.
Figure 16:
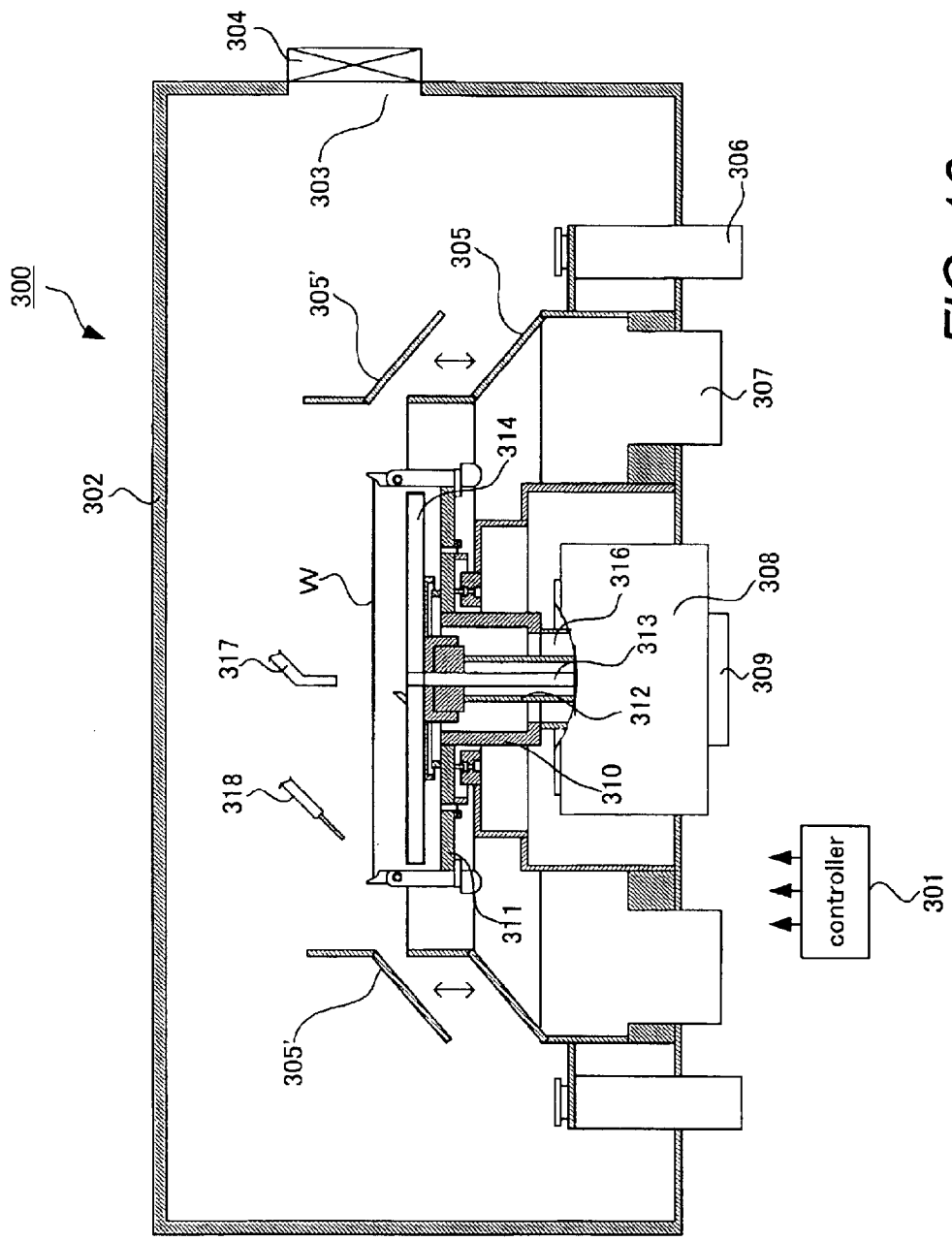
FIG. 16 is a view illustrating the structure of the processing apparatus according to a third embodiment.

According to the structure of FIG. 15, there are provided an edge washing nozzle 222, which supplies the washing solution to the edge portion of the wafer W from the back surface (lower surface) of the wafer W, and a sub nozzle 221, which blows the fluid to the edge of the plated surface (upper surface) of the wafer W.

At the time of the washing operation of the edge portion of the wafer W, fluid such as nitrogen gas, pure water is blown to the edge portion of the wafer W from the sub nozzle 221, and then the washing solution is supplied thereto from the edge washing nozzle 222. The washing solution, which is supplied from the edge washing nozzle 222 and is getting over to the plated surface side of the wafer W is blocked by the fluid, so that the selective washing of the edge portion of the wafer W can be carried out. It is noted that the number of the sub nozzles 221 and that of the edge washing nozzles 222 can be more than one.

Third Embodiment

An explanation will be given of the processing apparatus of the third embodiment with reference to the drawings accompanying herewith. The processing apparatus of the third embodiment structures a part of the plating apparatus that provides plating to a semiconductor wafer as shown in FIGS. 1 to 3.

The washing apparatus 300 is controlled by a controller 301. The controller 301 is composed of an arithmetic processing unit and ROM that stores a processing program, and controls the overall operation of the washing apparatus 300. It is noted that the controller 301 may control the entirety of the plating apparatus 11. Regarding the operation of the controller 301, the explanation will be omitted hereinafter to understand the entirety easily.

The washing apparatus 300 has a square housing 302. The housing 302 has a gate 303. The gate 303 has a gate valve 304. At the center of the interior of the housing 302, there is provided a substantially cylindrical cup 305 whose upper surface is opened. The cup 305 is movable up and down by a cup drive mechanism 306 such as a motor.

At the lower portion of the cup 305, an exhaust hole 307, which is connected to a pump, is provided, and exhaust gas containing waste solution such as washing solution flows thereto.

At the central position of the housing 302, a rotator 308 is provided. The rotator 308 is rotated at the given number of revolutions by the drive of a hollow motor 309. The rotator 308 is fixed to a first shaft 310. A rotation table 311 is fixed to the first shaft 310.

In the interior of the first shaft 310 of the rotator 308, a second shaft 312 is provided. In the interior of the second shaft 312, a pipe 313 is provided. The pipe 313 is connected to a tank of nitrogen gas and pure water, and the nitrogen gas and pure water flows alternately. A back surface washing nozzle 314 is also fixed to the second shaft 312.

Figure 17:
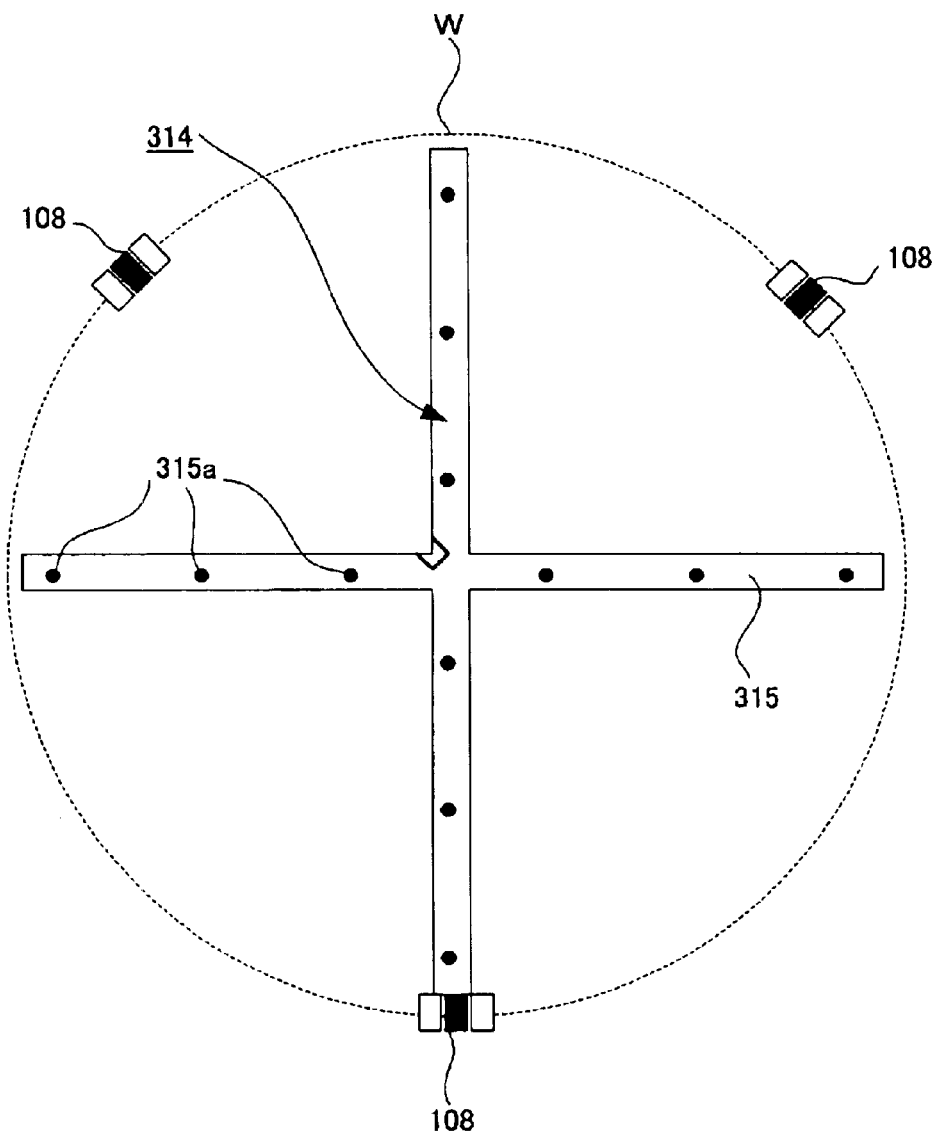
FIG. 17 is a view illustrating the structure of a back surface washing nozzle.

FIG. 17 shows the plane view of the back surface washing nozzle 314. As illustrated in FIG. 17, the back surface washing nozzle 314 has four rod members 315, which intersect one another in the shape of a cross, and each rod member 315 extends to the edge of the rotation table 311 from the center fixed to the second shaft 312. The interior of the rod member 315 is hollow, and communicates with the pipe 313 passing through the interior of the second shaft 312. Pure water is supplied upward from holes 315a formed at the upper portion of the rod member 315 of the back surface washing nozzle 314 through the pipe 313.

The same holding members 108 as those of the first embodiment illustrated in FIG. 5 are respectively attached to the edge of the rotation table 311 at an angle of substantially 120° at regular intervals. The wafer is mounted on the rotation table 311 in a state that the plated surface directs downward, and is held by the holding members 108. The wafer W mounted on the holding members 108 is firmly fixed by centrifugal force when the rotation table 311 is rotating. It is noted that the number of holding members 108 may be four or more.

A gas channel 316 is provided in a space between the shaft 210 and the second shaft 212, and an inert gas such as nitrogen gas flows therein. The inert gas flows into the edge of the rotation table 311 along the surface of the rotation table 311 and blows upwardly from the edge of the rotation table 311, that is, a portion in the vicinity of the edge portion of the wafer W. For this reason, it is possible to prevent particles and the like from adhering to the back surface of the wafer W.

Above the rotation table 311, a main washing nozzle 317 and an edge washing nozzle 318 are provided.

The main washing nozzle 317 connects to a pure water tank and an inert gas tank respectively. From the main washing nozzle 317, pure water, inert gas, for example, nitrogen gas is supplied to the surface of the wafer W. The main washing nozzle 317 is movable, and is designed such that the top end of the nozzle comes to the upper portion of the center of the wafer W when the wafer W is mounted on the rotation table 311.

The edge washing nozzle 318 connects to a washing solution tank and an inert gas tank in a changeable way. From the edge washing nozzle 318, the washing solution, inert gas, for example, nitrogen gas is supplied to the surface of the wafer W alternately. Here, as a washing solution, it is possible to use a mixture of acid chemical solution such as inorganic acid, e.g., hydrofluoric acid, hydrochloric acid, sulfuric acid or organic acid, and an aqueous hydrogen peroxide ($H_2O_2$), for example, a mixture of diluted hydrofluoric acid and aqueous hydrogen peroxide, e.g., a mixture of hydrofluoric acid: $H_2O_2$:$H_2O$=1:1:23. It is noted that diluted hydrofluoric acid and aqueous hydrogen peroxide may be respectively supplied from the different tank and mixed just before the main washing nozzle 317.

The edge washing nozzle 318 is movable, and the top end of the nozzle may direct to the edge portion of the wafer W, and the transfer of the wafer W by the second transfer mechanism 26 is not prevented when the wafer W is mounted on the rotation table 311.

Figure 18A:
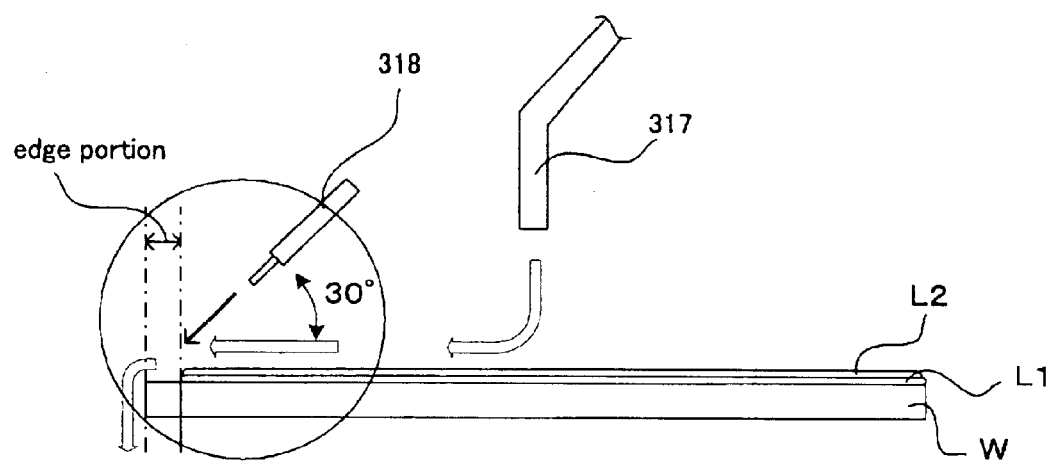
FIG. 18A is view for explaining a wafer edge washing method.
Figure 18B:
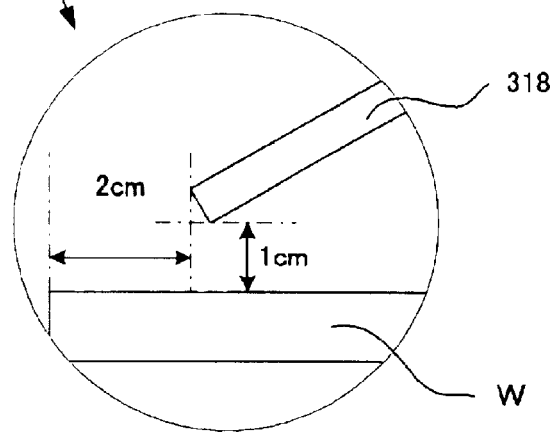
FIG. 18B is an enlarged view illustrating the edge portion.

The state when the processing apparatus 30 performs the washing operation is schematically illustrated in FIGS. 18A and 18B. As illustrated in FIG. 18A, on the surface of the edge of the wafer W, a copper seed layer L1 and a copper wiring layer L2 formed thereon are present. The edge washing nozzle 318 injects the washing solution to the edge portion of the wafer W to perform the washing (etching) of the edge portion of the wafer W in a state that pure water is supplied the entire surface of the wafer W from the main washing nozzle 317.

The edge washing nozzle 318 is movable, and is placed at the position, which is, e.g., 2 cm away from the end of the wafer W and 1 cm above the surface of the wafer W. The edge washing nozzle 318 is provided at an acute angle to the main surface of the wafer W, for example, an angle of 30° as illustrated in FIG. 18B.

The edge washing nozzle 318 is placed as mentioned above and the washing solution is injected to the edge portion of the wafer W. This makes it possible to wash the edge portion of the wafer W efficiently as preventing the washing solution and the dissolved the thin film from being scattered to the central direction of the wafer W with pure water supplied from the main washing nozzle 317.

Figure 19:
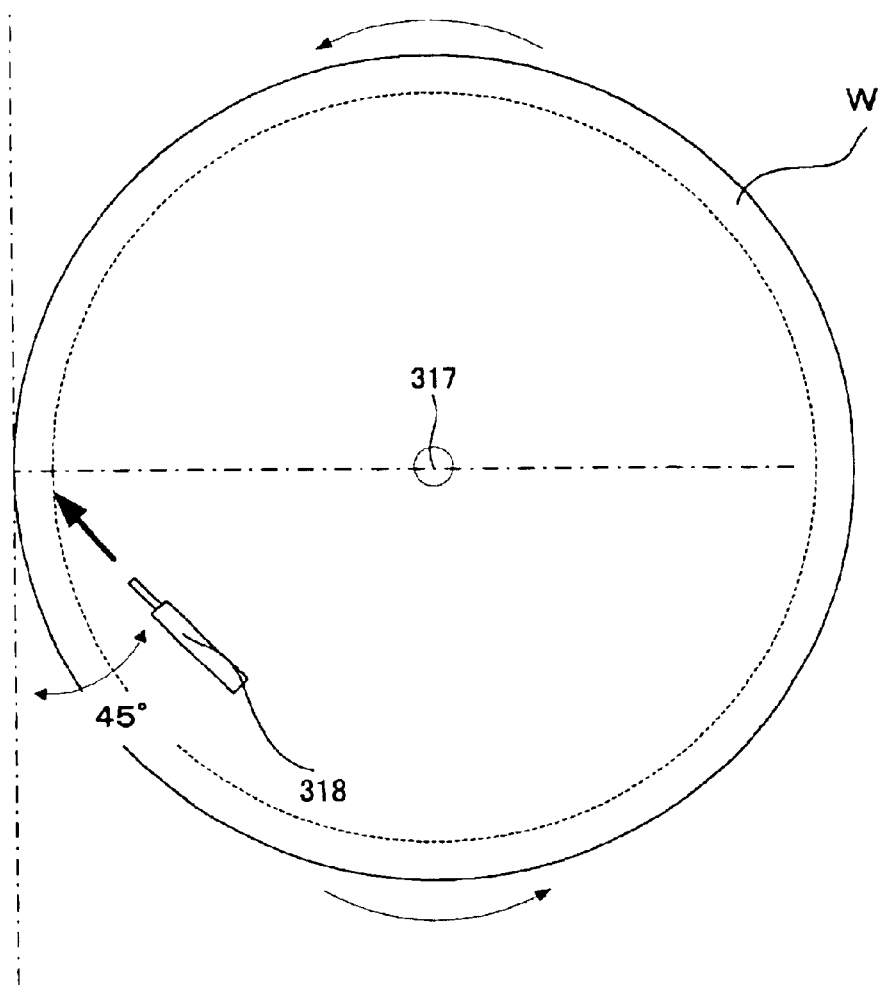
FIG. 19 is a view for explaining a wafer edge washing method.
Figure 20:
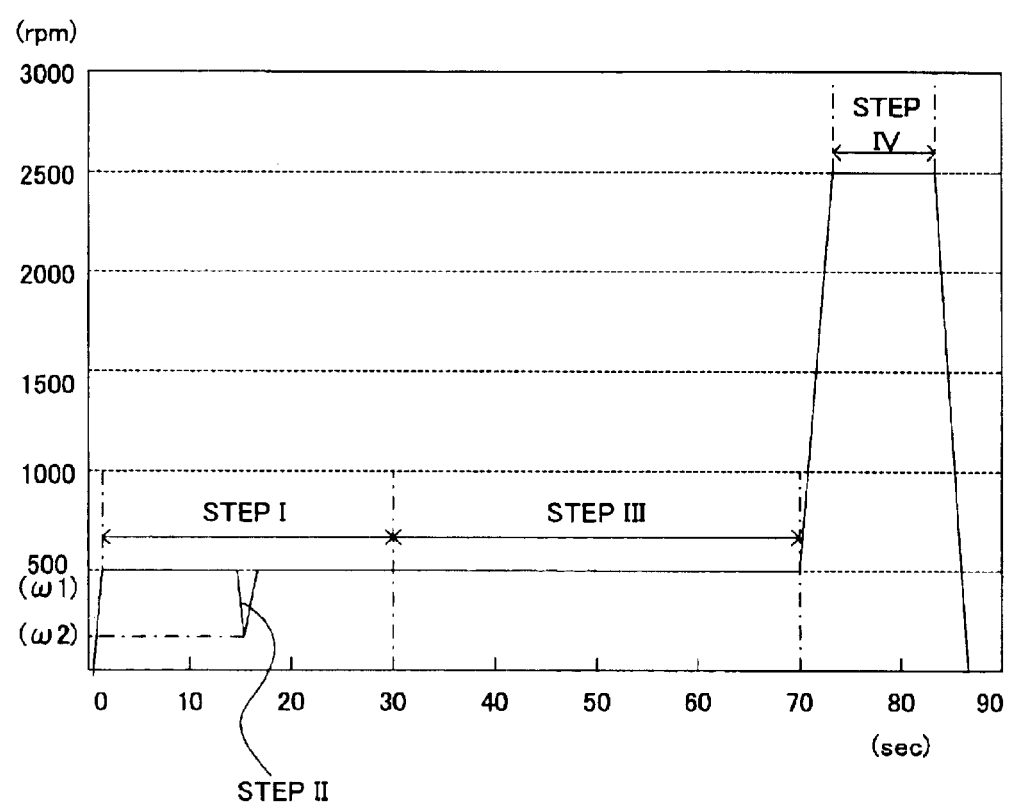
FIG. 20 is a timing chart for explaining a washing sequence.

Moreover, as illustrated in FIG. 19, the edge washing nozzle 318 is placed at an angle of 0° to 90°, e.g., 45° with respect to the rotational direction of the wafer W. This increases supply pressure of the washing solution to the edge portion of the wafer W because of the rotation of the wafer W and to perform efficient washing (removal of thin film). Thus, the placement of the edge washing nozzle 318 makes it possible to wash the edge portion of the wafer W with a high accurate width, for example, around 2 mm.

The placement of the edge washing nozzle 318 is not limited to the aforementioned example, and various modifications may be possible. Accordingly, the angle of the edge washing nozzle 318 to the main surface of the wafer W and the angle to the rotational direction of the wafer W are optimized to obtain a desired washing width of the wafer W. Moreover, the supply rates of pure water from the main nozzle 317 and that of washing solution from the edge washing nozzle 318 are adjustable, and the placement of the edge washing nozzle 318 is set based on the supply rates to obtain the desired washing width. The number of edge washing nozzle 318 may be more than one.

The main parts of the processing apparatus (washing apparatus) 300 according to the third embodiment are structured as mentioned above. The following will explain the washing sequence.

First, the first transfer mechanism 24 loads the wafer W to the plating apparatus 11 from the wafer cassette 25a and mounts the wafer W on the wafer table 27. The second transfer mechanism 26 loads the wafer on the wafer table 27 to the plating unit 28. The second transfer mechanism 26 unloads the wafer W subjected to plating from the plating unit 28 and sends it to the washing unit 29.

The second transfer mechanism 26 holding the wafer W subjected to plating accesses from the gate 303 and advances up to the position above the rotation table 311. The second transfer mechanism 26 mounts the wafer W on the rotation table 311, and the wafer W is held by the holding members 108. At this time, the wafer W is mounted thereon in the state that the plated surface thereof directs upward. After that, the second transfer mechanism 26 moves to the outside of the washing unit 29. At this time, the cup 305 placed at the lowest position rises up to the highest position 305'.

After the rise of the cup 305, the rotator 308 rotates by the hollow motor 309, and the rotation table 311 rotates in accordance with the rotation of the rotator 308. At this time, the wafer W rotates as being firmly fixed by the holding members 108 using centrifugal force.

After the number of revolutions of the rotation table 311 reaches a given value (for example, 200 to 300 rpm), the back surface of the wafer W and the edge thereof are washed (STEP I). In the case of washing the back surface of the wafer W and the edge thereof, first, pure water is supplied from the main washing nozzle 317. Sequentially, after pure water is sufficiently supplied to the entire back surface of the wafer W, the washing solution is supplied to the edge portion of the wafer W from the edge washing nozzle 318. The washing of the edge portion is performed for a given time (about 30 seconds). After the given time, the supply of the washing solution from the edge washing nozzle 318 is stopped, and sequentially the supply of pure water from the main washing nozzle 317 is stopped.

Here, the above STEP I includes STEP II shown below. In the STEP II, the entirety of the edge portion of the wafer W is washed such that the portion, which is held by the holding members 108 and which is not sufficiently washed, is also washed.

Figure 21:
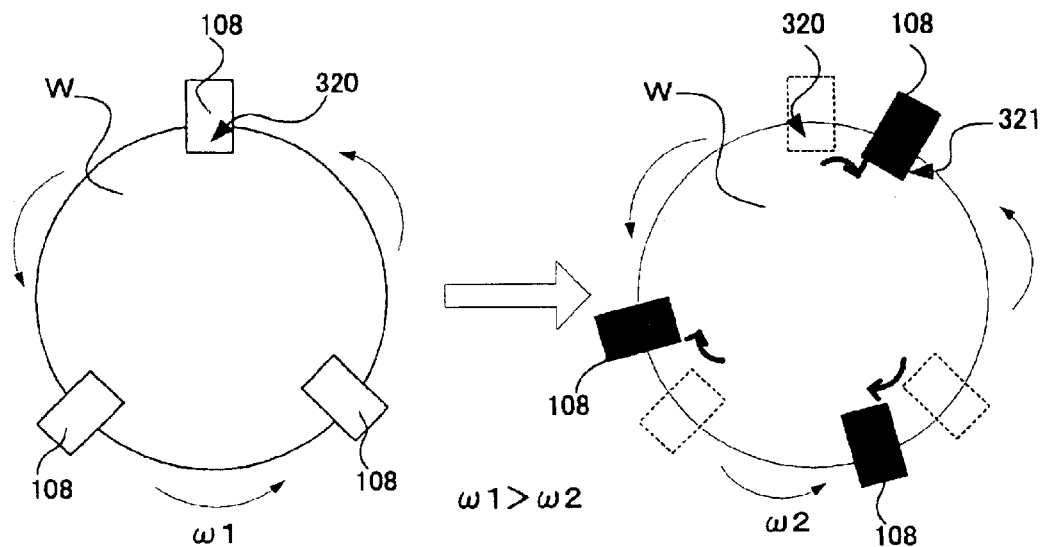
FIG. 21 is a view for explaining a wafer edge washing method.

In the STEP II, after the washing of the edge of the wafer W is performed for a given time, the number of revolutions of the rotation table 311 is reduced to ω2 from ω1. As illustrated in FIG. 21, the abrupt reduction in the number of revolutions decreases a pressing force against the wafer W of the holding portions 109 of the holding members 108. Moreover, a holding portion 320 of the wafer W held by the holding members 108 is shifted to a position 321 in the direction opposite to the rotational direction of the wafer W. After that, the number of revolutions of the rotation table 311 is returned to ω1 to fix the wafer W, and the edge of the wafer W is washed. This makes it possible to wash the wafer including the portion held by the holding members 108.

After the STEP I, both surfaces of the wafer W are washed with pure water (STEP III). The washing of wafer W with pure water is performed for a given time (about 40 seconds) after supplying pure water from the main washing nozzle 317 and the holes 315a of the back surface washing nozzle 314.

After the STEP III, the spin-drying of the wafer W is performed (STEP IV). In the STEP IV, the number of revolutions of the rotation table 311 can be increased to a given revolution number (2000 to 3000 rpm). At the same time, an inert gas, for example, nitrogen gas is supplied from the main washing nozzle 317 placed above the wafer W and the holes 315a of the back surface washing nozzle 314 placed below the wafer W for a predetermined time (about 10 seconds).

After the STEP IV, the rotation of the rotation table 311 is stopped. At this time, the fixation of wafer W by the holding members 108 using centrifugal force is released. After that, the cup 305 moves down to the lowest position. The wafer W is unloaded to the outer section of the washing unit 29 by the second transfer mechanism 26.

The second transfer mechanism 26 mounts the washed wafer W on the wafer table 27. The first transfer mechanism 24 unloads the wafer placed on the wafer table 27 from the interior o the plating apparatus 11, and stores the wafer W in the wafer cassette 23b. Up to this point, the processing using the plating apparatus 11 ends.

In the third embodiment, the change in the structure of the back surface washing nozzle 314 makes it possible to perform the washing of substrate more efficiently.

Figure 22:
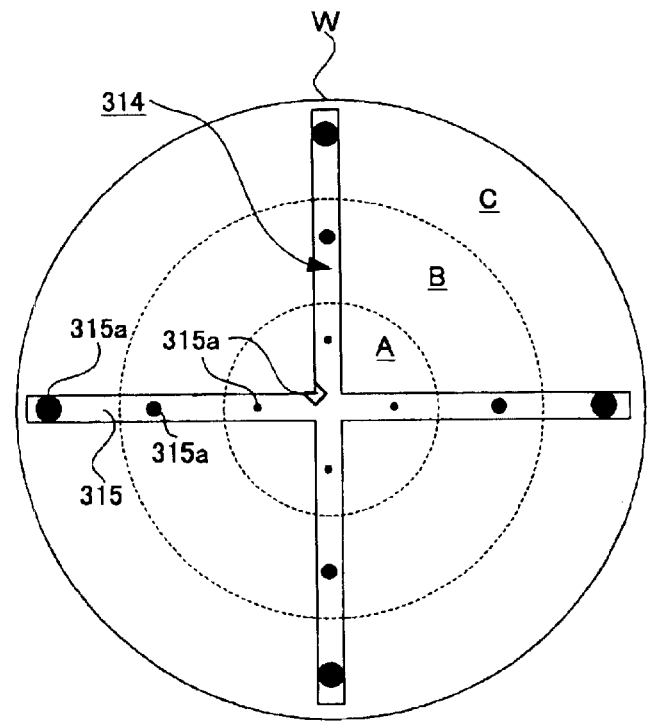
FIG. 22 is a view illustrating the other structural example of the back surface washing nozzle.

As illustrated in FIG. 22, the back surface washing nozzle 314 of the third embodiment has four rod members 315 that extend to the outside in the radius direction from the central portion. Then, the back surface washing nozzle 314 supplies the washing solution and pure water to the back surface of the wafer W from seven holes 315a formed at the upper side of the rod member 315. One hole 315a is provided at the center of the rod member 315, and three holes are provided at regular intervals from the center. All holes 315a have the same diameter.

However, since the wafer W is circular, the central portion of the wafer W and the end portion thereof are different from each other in the washing solution supply quantity per area. For example, it is assumed that the surface of the wafer W is divided into a central region (A), an intermediate region (B) and an end region (C) where a radius ratio is 1:2:3 in accordance with the distance from the center of the wafer W. In this case, an area ratio among regions A, B, and C is central region (A): intermediate region (B): end region (C)=1:3:5. The respective regions are different from one another in the washing solution supply quantity per area.

The difference in the washing solution supply quantity in the surface of the wafer W can be adjusted by changing the diameter of hole 315a. The number of holes 315a of each region is not limited to one. For example, in the case where the surface of the wafer W is divided into three regions A, B, and C, the adjustment is made such that a ratio of the total area of the holes 315a is central region A: intermediate region B: end region C=1:3:5. This makes it possible to equalize the quantity of the washing solution supplied to the respective regions A, B, and C of the wafer W.

Moreover, the wafer W is rotated and the center of the wafer W, thus the solution quantity supplied differs among the areas in the surface of the wafer W. For this, the adjustment can be made by changing the diameter of the hole with respect to the angular velocity of the rotation of the wafer W. The number of holes 315a of each region is not limited to one. For example, similar to the above, in the case where the surface of the wafer W is divided into three regions, A, B, and C, the adjustment of the solution supply is made such that a ratio of the total area of the holes is central region A: intermediate region B: end region C=1:2:3 since the ratio of angular velocity among the respective regions A, B, and C is central region A: intermediate region B: end region C=1:2:3. This makes it possible to equalize the washing area per solution supply in the overall surface of the wafer W.

In actual, since the circular wafer W is washed as being rotated, the above two methods may be preferably combined. In the case of combination of two methods, for example, similar to the above, if the surface of the wafer W is divided into three regions, A, B, and C, an optimal value of the ratio of the total area of the holes 315a becomes central region A: intermediate region B: end region C=1:2.5:3.

Though the wafer W is divided into three regions and the diameter of hole 315a is determined based on the ratio of the radius in the above case, the wafer W may be divided into four regions to determine the diameter of hole 315a in more detail. Also, the number of rod member 315 may be set more precisely, e.g., five or more.

The same effect can be obtained even in the method in which the diameters of all holes 315a are the same while the number of holes 315a is divided with respect to the respective regions of the wafer W. For example, similar to the above, in the case where the surface of the wafer W is divided into three regions, A, B, and C, a ratio of solution quantity to be supplied to the respective regions A, B, and C is set as the number of holes 315a is set in accordance with the ratio. For example, in the case where the ratio of solution quantity to be supplied to the respective regions A, B, and C is set to 1:2.5:4, the number of holes 315a to the respective regions A, B, and C of holes 315a is set to central region A: intermediate region B: end region C=1:2.5:4. This obtains an optimal washing effect.

The back surface washing nozzle 314 has a plurality of rod members 315. However, the back surface washing nozzle 314 may be formed like a disc where a channel for flowing the washing solution and a hole for blowing the washing solution are provided.

The first to third embodiments explained the case in which the plating apparatus was taken as an example of the processing apparatus. However, the present invention is not limited to the plating apparatus, and it can be applied to the processing apparatus that provides processing to the target with various kinds of solutions and chemicals. Also, the target can be applied to the glass substrate for a liquid crystal display device without limiting to the semiconductor wafer.

Various embodiments and changes may be made thereunto without departing from the broad spirit and scope of the invention. The above-described embodiments are intended to illustrate the present invention, not to limit the scope of the present invention. The scope of the present invention is shown by the attached claims rather than the embodiments. Various modifications made within the meaning of an equivalent of the claims of the invention and within the claims are to be regarded to be in the scope of the present invention.

This application is based on Japanese Patent Application Nos. 2000-135222 filed on May 8, 2000, 2000-135224 filed on May 8, 2000 and 2000-135226 filed on May 8, 2000, and including specification, claims, drawings and summary. The disclosure of the above Japanese Patent Application is incorporated herein by reference in its entirety.

What is claimed is:

1. A processing apparatus comprising:
   a holding member which holds and rotates a target;
   a first nozzle which supplies a first process solution to an edge portion of one surface of said target in a state that said holding member is holding and rotating said target;
   a second nozzle which supplies a second process solution to the edge portion of one surface of said target while said first nozzle is supplying said first process solution to said one surface of said target; and
   a sucking hole provided in the vicinity of the edge portion of said target, which sucks a discharge solution of said first process solution and said second process solution.

2. The processing apparatus according to claim 1, wherein said second nozzle supplies said second process solution to a downstream position in the rotational direction of said target relative to a position to which said first nozzle supplies said first process solution.

3. The processing apparatus according to claim 1, wherein said second nozzle supplies said second process solution to a position at a greater radial distance from the center of said target than a position to which said first nozzle supplies said first process solution.

4. The processing apparatus according to claim 1, wherein said first nozzle and said second nozzle are provided at an angle of 0° to 90° with respect to one surface of said target.

5. The processing apparatus according to claim 1, wherein said first nozzle and said second nozzle are provided in the vicinity of both surfaces of said target.

6. The processing apparatus according to claim 1, wherein a plurality of each of said first nozzle, said second nozzle and said sucking hole are provided around said target.

7. The processing apparatus according to claim 1, wherein said first nozzle, said second nozzle and said sucking hole are integrated, and are movable back and forth in the vicinity of the edge portion of said target at the time of processing said target.

8. The processing apparatus according to claim 1, wherein said first process solution and said second process solution comprise different types of process solutions.

9. The processing apparatus according to claim 1, wherein said first process solution comprises hydrogen peroxide and said second process solution comprises hydrofluoric acid.

10. A processing apparatus comprising:
    a holding member which holds and rotates a target;
    a supply nozzle provided at one surface side of said target, which supplies a process solution to the one surface of said target; and
    a blocking member provided in the other surface side of said target, which blocks the process solution which flows from the one surface to the other surface of said target to provide a given processing to an edge portion of the other surface.

11. The processing apparatus according to claim 10, wherein said blocking member is provided in the vicinity of the edge portion of the other surface of said target.

12. The processing apparatus according to claim 10, wherein said blocking member injects fluid to the edge portion of the other surface of said target.

13. A processing apparatus comprising:
    a holding member which holds and rotates a target;
    a first nozzle which supplies a first process solution to a central portion of a surface of said target in a state that said holding member is holding and rotating said target;
    a second nozzle which supplies a second process solution to an edge portion of the surface of said target while said first nozzle is supplying said first process solution to said one surface of said target; and
    a third nozzle having: a plurality of pipes radially provided on the same plane and through which a process solution flows; and a plurality of holes in each of said pipes, provided at the side opposite to one surface of said target, through which said process solution is supplied to the surface of said target;
    wherein the diameter of said holes increases from one end of each said pipe to the other end of each said pipe.

14. A processing system including:
    a transfer device which transfers a target; and
    a processing apparatus which provides predetermined processing to said target transferred to said processing apparatus by said transferring device;
    said processing apparatus comprising:
    a holding member which holds and rotates said target;
    a first nozzle which supplies a first process solution to an edge portion of one surface of said target in a state that said holding member is holding and rotating said target;
    a second nozzle which supplies a second process solution to the edge portion of one surface of said target while said first nozzle is supplying said first process solution to said one surface of said target; and
    a sucking hole provided in the vicinity of the edge portion of said target, which sucks a discharge solution of said first process solution and said second process solution.

15. The processing system according to claim 14, wherein said second nozzle supplies said second process solution to a downstream position in the rotational direction of said target relative to a position to which said first nozzle supplies said first process solution.

16. The processing system according to claim 14, wherein said second nozzle supplies said second process solution to a position at a greater radial distance from the center of said target than a position to which said first nozzle supplies said first process solution.

17. The processing system according to claim 14, wherein said first nozzle and said second nozzle are provided at an angle of 0° to 90° with respect to one surface of said target.

18. The processing system according to claim 14, wherein said first nozzle and said second nozzle are provided in the vicinity of both surfaces of said target.

19. The processing system according to claim 14, wherein a plurality of each of said first nozzle, said second nozzle and said sucking hole are provided around said target.

20. The processing system according to claim 14, wherein said first nozzle, said second nozzle and said sucking hole are integrated, and are movable back and forth in the vicinity of the edge portion of said target at the time of processing said target.

21. The processing system according to claim 14, wherein said first process solution and said second process solution comprise different types of process solutions.

22. A processing system including:
   a transfer device which transfers a target; and
   a processing apparatus which provides predetermined processing to said target transferred to said processing apparatus by said transferring device;
   said processing apparatus comprising:
   a holding member which holds and rotates said target;
   a supply nozzle provided at one surface side of said target, which supplies a process solution to the one surface of said target; and
   a blocking member provided at the other surface side of said target, which blocks the process solution which flows from the one surface to the other surface of said target to provide a given processing to an edge portion of the other surface.

23. The processing system according to claim 22, wherein said blocking member is provided in the vicinity of the edge portion of said other surface of said target.

24. The processing system according to claim 22, wherein said blocking member injects fluid to the edge portion of said other surface of said target.

25. A processing system including:
   a transfer device which transfers a target; and
   a processing apparatus which provides predetermined processing to the target transferred to said processing apparatus by said transferring device;
   said processing device comprising:
   a holding member which holds and rotates said target;
   a first nozzle which supplies a first process solution to a central portion of a surface of said target in a state that said holding member is holding and rotating said target;
   a second nozzle which supplies a second process solution to an edge portion of the surface of said target while said first nozzle is supplying said first process solution to said one surface of said target; and
   a third nozzle having a plurality of pipes radially provided on the same plane and through which a process solution flows; and a plurality of holes in each of said pipes, provided at the side opposite to one surface of said target, through which said process solution is supplied to the surface of said target,
   wherein the diameter of said holes increases from one end of each said pipe to the other end of each said pipe.

26. A processing method comprising the steps of:
   supplying a first process solution to one edge portion of a target in a state that said target is rotating;
   supplying a second process solution to a downstream position relative to a position to which said first process solution is supplied, wherein said second process solution is supplied to said downstream position while said first nozzle is supplying said first process solution to the edge portion of said target; and
   sucking atmosphere in the vicinity of the edge portion of said target to which said first and second process solutions are supplied.

27. The processing method according to claim 26, wherein said first process solution and said second process solution comprise different types of process solutions.

* * * * *